(12) United States Patent
Lee et al.

(10) Patent No.: US 10,021,741 B2
(45) Date of Patent: Jul. 10, 2018

(54) FLEXIBLE ORGANIC LIGHT EMITTING DISPLAY DEVICE

(71) Applicant: LG DISPLAY CO., LTD., Seoul (KR)

(72) Inventors: JaeYoung Lee, Paju-si (KR); Wonjae Yang, Seoul (KR); JoonWon Park, Seoul (KR); Tae-Kyung Kim, Yeosu-si (KR); Sangheun Lee, Seoul (KR); HaeRi Huh, Goyang-si (KR); HunHoe Heo, Daejeon (KR); Ji-Min Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 64 days.

(21) Appl. No.: 14/870,948

(22) Filed: Sep. 30, 2015

(65) Prior Publication Data

US 2016/0095172 A1    Mar. 31, 2016

(30) Foreign Application Priority Data

Sep. 30, 2014 (KR) .......................... 10-2014-0131653
Sep. 30, 2014 (KR) .......................... 10-2014-0131810
(Continued)

(51) Int. Cl.
*H05B 33/04* (2006.01)
*H05B 33/14* (2006.01)
(Continued)

(52) U.S. Cl.
CPC ........... *H05B 33/04* (2013.01); *C23C 16/401* (2013.01); *H01L 51/5253* (2013.01);
(Continued)

(58) Field of Classification Search
None
See application file for complete search history.

(56) References Cited

U.S. PATENT DOCUMENTS 6,111,357 A * 8/2000 Fleming .............. H01L 27/3276
                                                                313/504
2003/0164674 A1    9/2003 Imamura
(Continued)

FOREIGN PATENT DOCUMENTS

CN     1533682 A    9/2004
EP     2581958  *   4/2013
(Continued)

OTHER PUBLICATIONS

Ueno, S., et al., "Highly Reliable Encapsulation Films for OLEDs Composed of SiNx and SiOxCy prepared using SWP-CVD," ECS Transactions, vol. 50, No. 41, Apr. 2013, pp. 57-64.
(Continued)

*Primary Examiner* — Ashok Patel
(74) *Attorney, Agent, or Firm* — Dentons US LLP

(57) ABSTRACT

Provided is a flexible organic light emitting display device including a pixel area and a bezel area that includes a first inorganic encapsulation layer on an organic light emitting element of the pixel area; a second inorganic encapsulation layer that is relatively flatter than the first inorganic encapsulation layer and encapsulates a plurality of foreign matter compensation layers by contacting the first inorganic encapsulation layer in the bezel area; and a foreign matter compensation layer structure in which the plurality of foreign matter compensation layers are stacked between the first inorganic encapsulation layer and the second inorganic encapsulation layer.

12 Claims, 15 Drawing Sheets

(30) Foreign Application Priority Data

Nov. 30, 2014 (KR) .......................... 10-2014-0169336
Dec. 15, 2014 (KR) .......................... 10-2014-0180560

(51) Int. Cl.
*C23C 16/40* (2006.01)
*H01L 51/52* (2006.01)

(52) U.S. Cl.
CPC .......... *H05B 33/14* (2013.01); *H01L 51/5256* (2013.01); *H01L 2251/5338* (2013.01)

(56) References Cited

U.S. PATENT DOCUMENTS

| | | | |
|---|---|---|---|
| 2012/0098022 A1 | 4/2012 | Jan et al. | |
| 2012/0267646 A1* | 10/2012 | Kim | H01L 51/5253 257/88 |
| 2014/0021499 A1* | 1/2014 | Jang | H01L 51/0097 257/98 |

FOREIGN PATENT DOCUMENTS

| | | |
|---|---|---|
| EP | 2581958 A2 | 4/2013 |
| KR | 10-2014-0099043 A | 8/2014 |

OTHER PUBLICATIONS

"Highly Reliable Encapsulation Films for OLEDs Composed of SiNx and SiOxCy Prepared Using SWP-CVD"., S. Ueno, et al., ECS Transactions, Apr. 1, 2013.

* cited by examiner

FLEXIBLE ORGANIC LIGHT EMITTING DISPLAY DEVICE

This application claims the priority of Korean Patent Application No. 10-2014-0131810 filed on Sep. 30, 2014, Korean Patent Application No. 10-2014-0131653 filed on Sep. 30, 2014, Korean Patent Application No. 10-2014-0180560 filed on Dec. 15, 2014 and Korean Patent Application No. 10-2014-0169336 filed on Nov. 30, 2014, in the Korean Intellectual Property Office, the disclosures of which are incorporated herein by reference for all purposes as if fully set forth herein.

BACKGROUND OF THE INVENTION

Field of the Invention

The present disclosure relates to a flexible organic light emitting display device, and more particularly, to a flexible organic light emitting display device having a flexible encapsulation unit with improved flexibility.

Discussion of the Related Art

Display devices capable of displaying information have been rapidly developed. Research for improving performance, minimizing thickness, reducing weight, and lowering power consumption has been continued. As representative examples of the display devices, a liquid crystal display device (LCD), a plasma display panel device (PDP), a field emission display device (FED), an electro-wetting display device (EWD), an organic light emitting display device (OLED), and the like may be included.

In particular, unlike a liquid crystal display device, since an organic light emitting display device is a self-emission type of display, it does not require a separate light source. Thus, the organic light emitting display device can be manufactured in lightweight and thin form factors. Further, the organic light emitting display device is advantageous in terms of power consumption and is excellent in response speed, viewing angle, and contrast ratio. Therefore, the organic light emitting display device is considered as a next-generation display. However, in spite of these advantages, since the organic light emitting display device is particularly vulnerable to moisture and oxygen, the organic light emitting display device may have a problem in that it is difficult to secure manufacturing reliability than other display devices.

The organic light emitting display device typically includes an organic light emitting element constituted by an anode, an organic light emission layer, and a cathode. In the case of a top-emission type organic light emitting display device, the cathode has a transparent or translucent characteristic and the anode has a reflective characteristic in order to provide the light emitted from the organic light emission layer in an upward direction. Herein, holes provided in the anode and electrons provided in the cathode are coupled to emit light, and as a result, the organic light emission layer is vulnerable to moisture or oxygen. In detail, when moisture or oxygen permeates from the outside of the organic light emitting display device, the organic light emission layer is transmuted, and as a result, various failures including dark spot formation, pixel shrinkage, and the like can occur. Therefore, in order to secure the reliability of the organic light emitting display device, a transparent encapsulation unit for protecting the organic light emitting element from oxygen and moisture is used on the organic light emitting element.

In particular, since the organic light emitting display device is vulnerable to oxygen and moisture, the encapsulation unit of the organic light emitting display device is desired to have a higher performance level with respect to delaying or minimizing oxygen and/or moisture permeation than other types of electronic devices, such as liquid crystal display devices, plasma display panel devices, field emission display devices, electro-wetting display devices, solar cells, lithium ion batteries, sensors, and memory semiconductors.

In particular, it is difficult to develop an encapsulation unit of an organic light emitting display device which can be mass-produced while solving the aforementioned problems under a situation in which reliability, yield, process time, process difficulty, cost, and the like are related with each other in a trade-off relationship.

In recent years, a flexible organic light emitting display device has attracted attention as a next-generation display device. Flexible OLEDs allow for images to be properly displayed even if the substrate is curved, bent, folded, flexed, rolled, or otherwise manipulated in some non-planar forms.

Flexible organic light emitting displays have diverse applications, from personal portable devices to computers monitors and large screen TVs. Much research with respect to flexible OLEDs having reduced size (thickness) and weight in addition to a large display area has been in progress.

However, in the aforementioned general encapsulation unit configuration, since the thickness of the encapsulation unit is relatively large, an inorganic encapsulation layer of the encapsulation unit can be easily cracked or damaged by a stress generated by bending or folding a flexible organic light emitting display device.

Further, foreign matters, debris, undesired particles, etc. may be undesirably introduced onto the inorganic encapsulation layer during the manufacturing process. For example, if a bonding process is performed by using an adhesive layer attached to the inorganic encapsulation layer, a portion of the inorganic encapsulation layer may be pierced by a foreign matter. As a result, moisture and/or oxygen permeates into the organic light emission layer where piercing, imprinting, or punching phenomenon occurs, and as a result, dark spots or other detrimental effects may occur.

Meanwhile, since the encapsulation unit of the organic light emitting display device is formed after the organic light emission layer is formed, there may be limitations in the manufacturing process. For example, since the organic light emission layer is vulnerable to heat, the encapsulation unit is desired not to be formed by any process requiring a temperature above a certain level.

SUMMARY OF THE INVENTION

Accordingly, the present invention is directed to provide an organic light emitting display device and method of manufacturing the same that substantially obviates one or more problems due to limitations and disadvantages of the related art.

An advantage of the present invention is directed to provide a flexible organic light emitting display device that includes a novel flexible encapsulation unit.

The inventors of the present disclosure have intended to implement, for example, an encapsulation unit of a top-emission type flexible organic light emitting display device having a small thickness and encountered various problems.

First, the flexible encapsulation unit is desired to be deposited by a relatively low-temperature process. In the case where the encapsulation unit is formed after the organic light emitting element is deposited, when a surface temperature of the organic light emitting element is 120° C. or higher, the organic light emitting element may be degraded. Accordingly, a low-temperature deposition process that can maintain the surface temperature of the organic light emitting element at 110° C. or lower is demanded.

Second, the flexible encapsulation unit is vulnerable to foreign matter. In particular, an inorganic layer is generally excellent in performance for delaying oxygen and/or moisture permeation, but lacks foreign matter compensation capability. In other words, the flexible encapsulation unit should be of a material and structure that can cover up or otherwise minimize the detrimental effects of undesired debris or particles to thus reduce the chances of such from causing damage. Otherwise, when the encapsulation unit is formed of the inorganic layer, cracks and other deformities may be caused by the foreign matter. In particular, a moisture/oxygen permeation path occurs in the encapsulation unit even by a single tiny crack or seam, and as a result, dark spot failures or the like may occur in the flexible organic light emitting display device. Accordingly, the encapsulation unit that can reduce failures by compensating the foreign matters is desired. In particular, as the thickness of the flexible encapsulation unit is minimized, the difficulty in compensation of the foreign matters is aggravated.

Third, the flexible encapsulation unit is desired to be able to maintain (or not disturb) the quality of images displayed via a pixel area. In particular, when a transparency with respect to visible light (having a wavelength range of 380 to 680 nm) of the flexible encapsulation unit is relatively low, problems such as a decrease in luminance and a color temperature deviation may occur. In addition, the flexible encapsulation unit is desired to be isotropic in order to maintain the quality of the image. Accordingly, as materials constituting the flexible encapsulation unit, such should have a visible light transmittance of 90% or higher and isotropic characteristics are desired.

Fourth, the flexible encapsulation unit is desired to be highly flexible. In particular, stress cracks due to bending may occur in the flexible encapsulation unit. When the crack occurs in the flexible encapsulation unit, the moisture and/or oxygen permeation path occurs, and as a result, the flexible organic light emitting display device may fail to operate properly. In particular, as the thickness of the flexible encapsulation unit increases, stress applied to the flexible encapsulation unit increases while bending, and as a result, cracks may easily form. Accordingly, the encapsulation unit having the small thickness is beneficial for excellent bending performance.

Fifth, the organic light emitting element is desired to be suppressed from being damaged due to oxygen and moisture which may be generated during a manufacturing process of the flexible encapsulation unit. In particular, there is a possibility that a light emission failure will occur due to oxidation of the organic light emitting element by oxygen plasma generated during forming of the flexible encapsulation unit. Accordingly, a process that can alleviate the problem is beneficial.

From the foregoing, some of the following advantages may be obtained by practicing some or more aspects of the present invention.

An advantage of the present disclosure is to provide a flexible organic light emitting display device including a flexible encapsulation unit and a manufacturing method of the flexible organic light emitting display device which can solve the aforementioned problems.

Another advantage of the present disclosure is to provide a flexible organic light emitting display device and a manufacturing method of the flexible organic light emitting display device which can minimize a piercing, an imprinting, or a punching phenomenon that can cause the flexible encapsulation unit to be damaged. Such a phenomenon occurs due to foreign matter, debris, and the like when a lower substrate and a barrier film are bonded by using a pressure sensitive adhesive layer by planarizing the top of a flexible encapsulation unit.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a flexible organic light emitting display device including a pixel area and a bezel area may, for example, include a first inorganic encapsulation layer on an organic light emitting element of the pixel area; a second inorganic encapsulation layer that is relatively flatter than the first inorganic encapsulation layer and encapsulates a plurality of foreign matter compensation layers by contacting the first inorganic encapsulation layer in the bezel area; and a foreign matter compensation layer structure in which the plurality of foreign matter compensation layers are stacked between the first inorganic encapsulation layer and the second inorganic encapsulation layer.

The first and second inorganic encapsulation layers and the foreign matter compensation layer structure may protect the organic light emitting element from oxygen and/or moisture.

The plurality of foreign matter compensation layers may be stacked on a basis of flowability of materials configuring the plurality of foreign matter compensation layers, capability of suppressing possible damage generated during manufacturing, flexibility, and reduction in thickness.

The plurality of foreign matter compensation layers may include a first foreign matter compensation layer having at least first hardness and foreign matter compensation capability and a second foreign matter compensation layer having second hardness relatively higher than the first hardness and configured to protect the first foreign matter compensation layer from the damage.

The foreign matter compensation layers including at least the first foreign matter compensation layer and the second foreign matter compensation layer may be configured to have a structure in which at least two flowable silicon oxycarbon layers formed by a chemical vapor deposition method are stacked.

The foreign matter compensation layers including at least the first foreign matter compensation layer and the second foreign matter compensation layer may be configured so that the carbon contents are gradationally reduced in an upward direction from a layer on a bottom layer to a layer on a top layer.

The flexible organic light emitting display device may further include a protective layer disposed between the first foreign matter compensation layer and the second foreign matter compensation layer and having relatively higher hardness and relatively lower flowability than the first foreign matter compensation layer.

An end of the first foreign matter compensation layer and an end of the second foreign matter compensation layer may be positioned more inside than an end of the first inorganic encapsulation layer, an end of the second inorganic encapsulation layer may be positioned more outside than the end of the first foreign matter compensation layer and the end of the second foreign matter compensation layer, and the second inorganic encapsulation layer may be configured to encapsulate the first foreign matter compensation layer and the second foreign matter compensation layer by bonding the first inorganic encapsulation layer in the bezel area.

The flexible organic light emitting display device may further include a planarization foreign matter compensation layer disposed in a portion of the bezel area and the pixel area between the second foreign matter compensation layer and the second inorganic encapsulation layer and having a thickness of 10 μm or less.

The flexible organic light emitting display device may further include a planarization foreign matter compensation layer disposed in a portion of the bezel area and the pixel area on the second inorganic encapsulation layer and made of an acryl resin, a silicon resin, or an epoxy resin.

The flexible organic light emitting display device may further include a pressure sensitive adhesive layer adhering to the planarization foreign matter compensation layer; and a barrier film on the pressure sensitive adhesive layer.

The flexible organic light emitting display device may further include an anti-oxidation layer disposed below the first inorganic encapsulation layer, in which the first foreign matter compensation layer may include at least oxygen, and the first inorganic encapsulation layer may be made of aluminum oxide.

The flexible organic light emitting display device may further include a third inorganic encapsulation layer disposed between the second foreign matter compensation layer and the planarization foreign matter compensation layer.

The second inorganic encapsulation layer may be made of a silicon based material, the third inorganic encapsulation layer may be made of an aluminum based material, step coverage performance of the third inorganic encapsulation layer may be relatively more excellent than the step coverage performance of the second inorganic encapsulation layer, and a thickness of the second inorganic encapsulation layer may be larger than a thickness of the third inorganic encapsulation layer.

The third inorganic encapsulation layer may be made of a silicon based material, the second inorganic encapsulation layer may be made of an aluminum based material, step coverage performance of the second inorganic encapsulation layer may be relatively more excellent than the step coverage performance of the third inorganic encapsulation layer, and a thickness of the third inorganic encapsulation layer may be larger than a thickness of the second inorganic encapsulation layer.

The flexible organic light emitting display device may further include a third foreign matter compensation layer disposed in a portion of the bezel area and the pixel area on the second foreign matter compensation layer; and a fourth foreign matter compensation layer disposed in a portion of the bezel area and the pixel area on the third foreign matter compensation layer, in which the third foreign matter compensation layer and the fourth foreign matter compensation layer may be configured of silicon oxycarbon (SiOC) having different carbon contents, and the carbon content of the third foreign matter compensation layer may be larger than the carbon content of the fourth foreign matter compensation layer.

The second foreign matter compensation layer may be made of acryl, silicon, or epoxy and on the first foreign matter compensation layer, and the first foreign matter compensation layer may be configured to protect the second foreign matter compensation layer while compensating a foreign matter.

Details of other exemplary embodiments will be included in the detailed description of the disclosure and the accompanying drawings.

According to exemplary embodiments of the present disclosure, the following effects may be achieved.

First, in a flexible encapsulation unit according to an embodiment of the present disclosure, a plurality of foreign matter compensation layers having different characteristics are disposed to correspond to each other to compensate for foreign matters and to reduce the thickness of the flexible encapsulation unit.

Second, in a flexible encapsulation unit according to an embodiment of the present disclosure, a first foreign matter compensation layer made of silicon oxycarbon having flowability (i.e., an ability to alleviate a critical step level or other irregularities caused by foreign matter, by covering the foreign matter such that the slope or non-evenness of the upper surface of the foreign matter compensation layer is formed to be gradual or gentle) is on an inorganic encapsulation layer positioned at the bottom-most part of the flexible encapsulation unit, suppress damage of the flexible encapsulation unit which can occur when an epoxy based second foreign matter compensation layer is formed (i.e., an epoxy based second foreign matter compensation layer, on the first foreign matter compensation layer, is formed by a screen printing method, whereby the mask of the screen printing may cause scratch damage), and reduce the thickness of the flexible encapsulation unit.

Third, in a flexible encapsulation unit according to an embodiment of the present disclosure, the flexibility of the flexible light emitting display device can be maximized by minimizing the thickness of the encapsulation unit.

Fifth, in a flexible encapsulation unit according to an embodiment of the present disclosure, it is possible to suppress a surface failure (e.g., a surface deformation damage cause during a manufacturing process in which plasma is generated) of the foreign matter compensation layer having the desired flowability, while compensating the foreign matters by using a plurality of foreign matter compensation layers. A plurality of foreign matter compensation layers have an interface made of silicon oxycarbon having the flowability and a foreign matter compensation layer having a protective layer made of silicon oxycarbon having no flowability.

Sixth, in a flexible encapsulation unit according to an embodiment of the present disclosure, it is possible to complement the disadvantages and strengthen the advantages of respective foreign compensation layers and inorganic encapsulation layers by using a method and structure using two types of foreign matter compensation layers and two types of inorganic encapsulation layers. As a result, the overall thickness of the flexible encapsulation unit can be reduced.

Seventh, in a flexible encapsulation unit according to an embodiment of the present disclosure, occurrence of piercing, imprinting, or punching phenomenon can be minimized due to the foreign matters disposed in the flexible encapsulation unit or on the flexible encapsulation unit during a process of bonding a lower substrate and a barrier film with pressure applied to both.

Eighth, in a flexible encapsulation unit according to an embodiment of the present disclosure, by differentiating flowability and hardness characteristics in each of the plurality of foreign matter compensation layers made of silicon oxycarbon, a flexible organic light emitting display device having a critical radius value of curvature of 10 R or less can be provided.

Ninth, in a flexible encapsulation unit according to an embodiment of the present disclosure, when an aluminum oxide ($Al_xO_y$) based inorganic encapsulation layer is deposited on silicon oxycarbon, damage by plasma which can occur during a manufacturing process can be minimized by controlling the flowability and hardness of silicon oxycarbon.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1A:
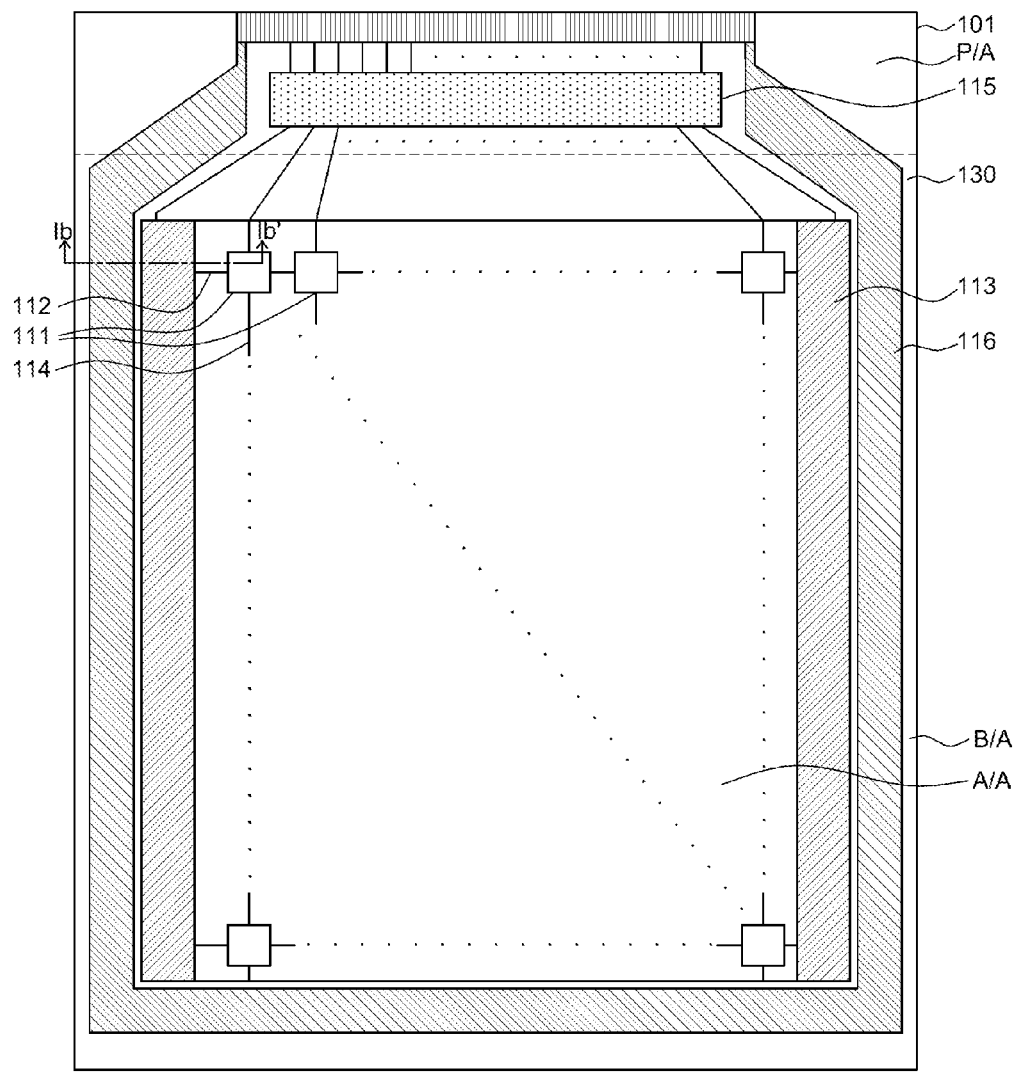
FIG. 1A is a schematic plan view of a flexible organic light emitting display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "comprising", "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

Figure 1B:
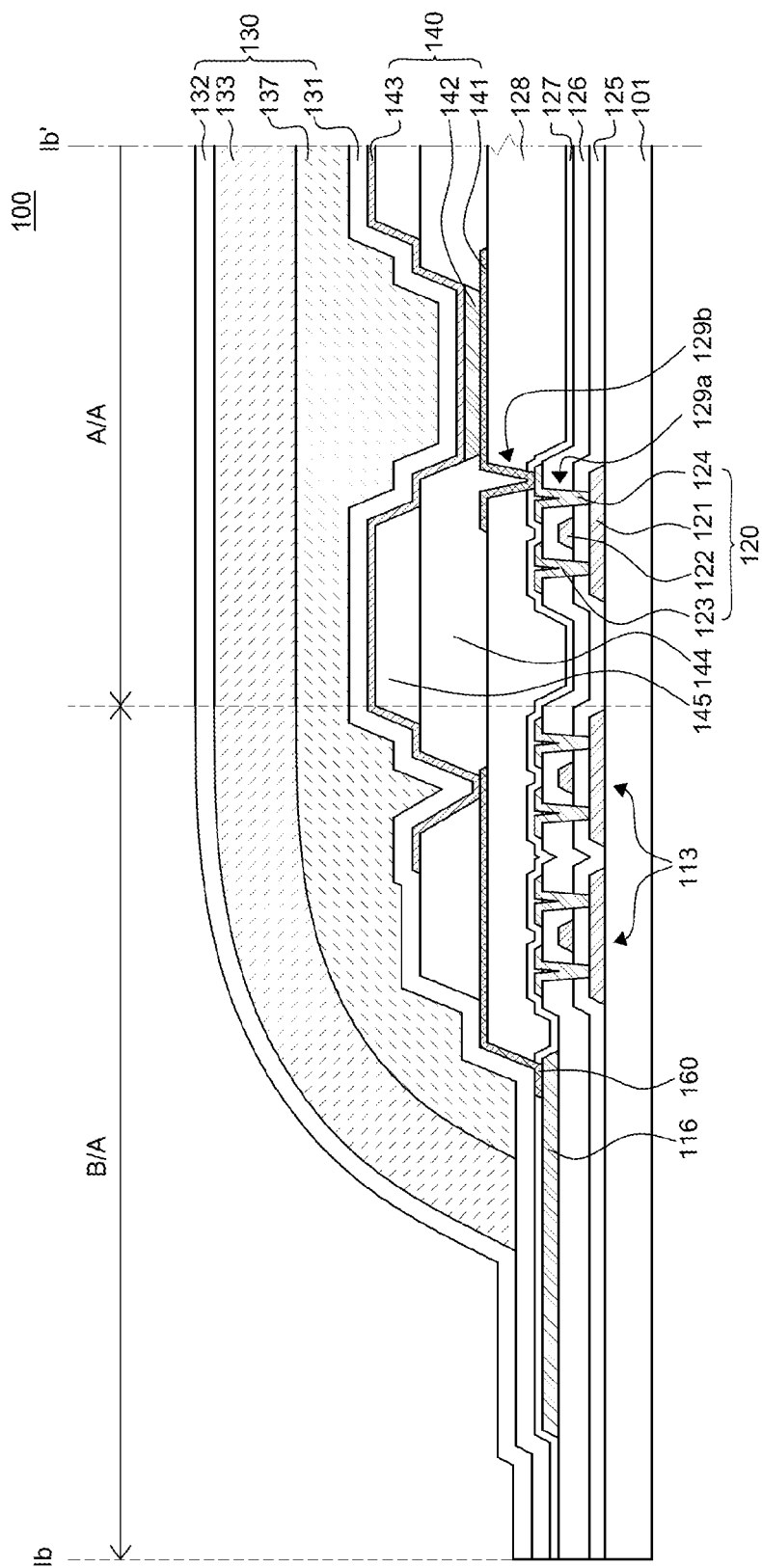
FIG. 1B is a schematic cross-sectional view of Ib-Ib' of FIG. 1A.

FIG. 1A is a schematic plan view of a flexible organic light emitting display device according to an exemplary embodiment of the present disclosure. FIG. 1B is a schematic cross-sectional view of Ib-Ib' of FIG. 1A.

A pixel area A/A of the present disclosure means an area where a plurality of pixels 111 (with related components, wiring, etc.) are disposed. A pad area P/A of the present disclosure means an area where a plurality of pads (with related components, wiring, etc.) are disposed. A bezel area B/A of the present disclosure means an area surrounding the pixel area A/A. In the pixel area A/A of the flexible organic light emitting display device 100, the plurality of pixels 111, a plurality of data lines 114 transferring data signals generated in a data driver 115 to the plurality of pixels 111, and a plurality of gate lines 112 transferring gate signals generated in a gate driver 113 to the plurality of pixels 111 are disposed.

In the bezel area B/A of the flexible organic light emitting display device 100, a gate driver 113 configured to transfer gate signals to a plurality of gate lines 112 and a common voltage line 116 configured to apply common voltage ELVSS to cathodes of the plurality of pixels 111 are disposed. It is illustrated that the common voltage line 116 surrounds three sides of the bezel area B/A, but it is not limited thereto, and the common voltage line 116 may be on only at least one side of the bezel area B/A. Some elements disposed in the bezel area B/A may be extended and disposed up to the pad area P/A. For example, the plurality of data lines 114 and/or the common voltage line 116 may be disposed throughout the bezel area B/A and the pad area P/A.

In addition, in the common voltage line 116, in order to reduce undesirable cathode voltage rising problems that can occur in a partial area in the pixel area A/A due to cathode resistance of the pixel area A/A, an auxiliary cathode electrode may be additionally disposed in the pixel area A/A.

In the pad area P/A of the flexible organic light emitting display device 100, the data driver 115 configured to transfer image signals to the plurality of data lines 114 and the plurality of data lines 114 connected with the data driver 115 are disposed.

In the pad area P/A, a plurality of pads are disposed. An anisotropic conductive film (ACF) is coated on the plurality of pads. Components such as the data driver 115, a flexible printed circuit (FPC), or a cable are bonded to the pad by the ACF.

A flexible encapsulation unit 130 according to an exemplary embodiment of the present disclosure is configured to cover the bezel area B/A and the pad area P/A. In this case, the flexible encapsulation unit 130 is configured to specifically expose the plurality of pads formed in the pad area P/A. In detail, since the flexible encapsulation unit 130 has excellent performance for delaying moisture/oxygen permeation and excellent electrical insulation, when the flexible encapsulation unit 130 covers the pad area P/A, the plurality of pads formed in the pad area P/A being insulated may be problematic. Further, the flexible encapsulation unit 130 is configured to be extended from the outside of the pixel area P/A to cover only at least a partial area of the bezel area B/A while covering all of the pixel area P/A. Namely, but the flexible encapsulation unit 130 may be patterned in the bezel area B/A. In such a configuration, when a crack or other deformity forms at or in an outer area of the flexible organic light emitting display device 100, such a crack may be blocked from being further propagated (or extended) along or into the flexible encapsulation unit 130.

The plurality of pixels 111 are on a lower substrate 101. The plurality of pixels 111 include sub pixels respectively emitting light of at least one among red, green, and blue (RGB) colors. The plurality of pixels 111 may further include a sub pixel emitting light of white color. Each sub pixel may further include a color filter or color refiner that act to pass or restrict light waves of certain bandwidth. The plurality of pixels 111 are configured to be driven by a plurality of thin film transistors (TFTs) connected to the plurality of gate lines 112 and the plurality of data lines 114 which are formed to cross each other.

The data driver 115 generates a gate start pulse and a plurality of clock signals driving the gate driver 113. The data driver 115 converts a digital image signal received from the outside into an analogue image signal by using gamma voltages generated in a gamma voltage generator. The converted image signal is transferred to the plurality of pixels 111 through the plurality of data lines 114. The data driver 115 may be bonded to the plurality of pads configured on the lower substrate 101.

The gate driver 113 includes a plurality of shift registers, and each shift register is connected to each gate line 112. The gate driver 113 receives the gate start pulses (GSP) and the plurality of clock signals from the data driver 115, and the shift register of the gate driver 113 activates the plurality of pixels 111 connected to each gate line 112 while shifting the GSPs in sequence.

The common voltage line 116 is disposed in the bezel area B/A to supply the common voltage ELVSS to the cathode. The cathode of the top emission type flexible organic light emitting display device 100 is formed in a thin film for transmittance. Accordingly, the cathode has a high electrical resistance. Accordingly, a voltage drop phenomenon occurs, which causes the quality of the display image to deteriorate. In order to alleviate this problem, the common voltage line 116 is disposed to surround the pixel area A/A. However, it is not limited thereto, and the common voltage line 116 may be formed on at least one side of the pixel area A/A. In addition, when a large-sized flexible organic light emitting display device is to be manufactured, auxiliary electrodes may be additionally disposed.

Hereinafter, a cross section Ib-Ib' of the flexible organic light emitting display device 100 will be described in detail with reference to FIG. 1B.

The flexible organic light emitting display device 100 includes a flexible lower substrate 101, a thin film transistor 120 on the lower substrate 101, an organic light emitting element 140 driven by the thin film transistor 120, a gate driver 113 formed in the bezel area B/A, the common voltage line 116 formed in the bezel area B/A to supply the common voltage ELVSS to a cathode 143, a cathode connection unit 160 connecting the cathode 143 and the common voltage line 116, and the flexible encapsulation unit 130 protecting the pixel area A/A from moisture and oxygen.

The lower substrate 101 supports various constituent elements of the flexible organic light emitting display device 100 formed on the lower substrate 101. The lower substrate 101 may be of an insulating material having flexibility. For example, the lower substrate 101 may be made of a plastic material such as polyimide PI.

A back plate supporting the flexible organic light emitting display device 100 may be additionally on the bottom of the lower substrate 101 so as to suppress the flexible organic light emitting display device 100 from being too easily deformed. Accordingly, such a back plate can provide a support force for suppressing the flexible organic light emitting display device 100 from being too easily deformed.

The thin film transistor 120 includes an active layer 121, a gate electrode 122, a source electrode 123, and a drain electrode 124. The active layer 121 is covered by a gate insulation layer 125. The gate electrode 122 is on the gate insulation layer 125 with the same material as the gate line 112 so as to overlap with at least a partial region of the active layer 121.

The gate electrode 122 is covered by an insulating interlayer 126 formed on the entire surface of the gate insulation layer 125. The insulating interlayer 126 may be formed with a double-layered structure made of silicon nitride and silicon oxide.

The source electrode 123 and the drain electrode 124 are formed on the insulating interlayer 126 to be spaced apart from each other, and formed of the same material as the data line 114. The source electrode 123 is connected with one end of the active layer 121 and connected with the active layer 121 through a first contact hole 129a passing through the gate insulation layer 125 and the insulating interlayer 126. In addition, the drain electrode 124 overlaps with the other end of the active layer 121 and connected with the active layer 121 through a contact hole passing through the gate insulation layer 125 and the insulating interlayer 126. Hereinabove, it is described that the thin film transistor 120 has a coplanar structure, but an inverted staggered structure or other configurations may also be used.

A thin film transistor insulation layer 127 is on the thin film transistor 120. However, it is not limited thereto, and the thin film transistor insulation layer 127 may not be disposed. The thin film transistor insulation layer 127 may additionally block moisture/oxygen permeated from the lower substrate 101.

An overcoating layer 128 is on the thin film transistor insulation layer 127. A second contact hole 129b passes through the overcoating layer 128 and the thin film transistor insulation layer 127. The overcoating layer 128 may be made of photo-acryl which is a material with a low dielectric constant. For example, a thickness of the overcoating layer 128 is between 2 μm to 3.5 μm. For example, a thickness of the overcoating layer 128 is 2.3 μm. The overcoating layer 128 can reduce a parasitic-capacitance generated between an anode 141 and the thin film transistor 120, the gate line 112, and the data line 115 and improve the flatness or surface evenness of the anode 141.

A micro-lens for improving light extraction efficiency may be patterned at the overcoating layer 128 in an area where the anode 141 is disposed.

The organic light emitting element 140 includes the anode 141 and the cathode 143 facing each other, and an organic light emission layer 142 interposed therebetween. A light emission area of the organic light emission layer 142 may be defined or separated by a bank 144.

The organic light emitting element 140 may be configured to emit light of any one of red, green, and blue (RGB) and also be configured to light of white. When the organic light emitting element 140 emits white light, a color filter or color refiner may be added in order to provide the necessary colors to be output.

The anode 141 is disposed to correspond to the light emission area of each pixel 111 on the overcoating layer 128 and connected with the drain electrode 124 of the thin film transistor 120 through the second contact hole 129b passing through the overcoating layer 128. The anode 141 is made of a metallic material having a high work function. The anode 141 is made of a reflective material to have a reflective characteristic. Alternatively, a reflective plate or layer can be added below the anode 141. An image signal used for displaying an image is applied to the anode 141 through the drain electrode 124.

The bank 144 is disposed in a non-light emission area between the pixels 111 on the overcoating layer 128 and may have a tapered shape. The bank 144 is configured to overlap at least a portion of an edge of the anode 141. For example, a height of the bank 144 can be between 1 μm to 2 μm. For example, a height of the bank 144 is 1.3 μm.

A spacer 145 is on the bank 144. The spacer 145 may be of the same material as the bank 144. For example, the bank 144 and the spacer 145 may be formed of polyimide. The spacer 145 may protect damage of the organic light emitting element 140 which may be generated by a fine metal mask (FMM) or a shadow mask used when the organic light emission layer 142 is patterned. For example, a height of the spacer 145 can be between 1.5 μm to 2.5 μm. For example a height of the spacer 145 is 2 μm. According to the aforementioned configuration, in the FMM process, the damage of the organic light emitting element 140 may be reduced.

The organic light emission layer 142 is formed on the anode 141. The cathode 143 is disposed to face the anode 141 with the organic light emission layer 142 therebetween. The organic light emission layer 142 may be made of a phosphorescent or fluorescent material (or a combination thereof) and may further include an electron transport layer, a hole transport layer, a charge generation layer, and the like.

The cathode 143 is made of a metallic material having a low work function with the very small thickness, such as transparent conductive oxide (TCO). When the cathode 143 is made of the metallic material, for example, the cathode 143 can be formed with a thickness of 1,500 Å or less. For example, the cathode 143 is formed with a thickness of 200 Å to 400 Å. When the cathode 143 is formed to be sufficiently thin, the cathode 143 becomes a substantially transparent layer or a translucent layer. The common voltage ELVSS is applied to the cathode 143.

The gate driver 113 comprises a plurality of thin film transistors. The plurality of thin film transistors configuring the gate driver 113 are formed in the same process of the thin film transistor 120 of the pixel area A/A. Accordingly, the duplicated description for the thin film transistors configuring the gate driver 113 will be omitted merely for avoiding redundancy.

The common voltage line 116 is configured of a single layer or a plurality of layers by using the same material as the gate line 112 and/or the data line 114.

The common voltage line 116 supplies the common voltage ELVSS to the cathode 143. The thin film transistor insulation layer 127 may be on the common voltage line 116. The common voltage line 116 is disposed outside the gate driver 113.

The cathode connection unit 160 may be on the overcoating layer 128 to overlap with the gate driver 113. The cathode connection unit 160 connects the common voltage line 116 and the cathode 143. The cathode connection unit 160 may be made of the same material as the anode 141.

The cathode connection unit 160 is connected with the common voltage line 116 along a slope of one end of the overcoating layer 128. In addition, when an insulation layer exists between the cathode connection unit 160 and the common voltage line 116, a contact hole is configured.

The cathode 143 is on the bank 144 and/or the spacer 145 to be extended up to a portion of the bezel area B/A. The cathode 143 is connected with the cathode connection unit 160 in the bezel area B/A without the bank 144.

In summary, the gate electrode 122 of the thin film transistor 120 receives a driving signal generated in the gate driver 113 through the gate line 112. In addition, conductivity of the active layer 121 is varied by a signal applied to the gate electrode 122. In addition, an image signal applied to the source electrode 123 is applied to the anode 141 through the active layer 121. In addition, when the common voltage ELVSS is applied to the cathode 143, the organic light emission layer 142 emits light used to display images.

Hereinabove, the cross-sectional structure of the thin film transistor 120 and the organic light emitting element 140 on the bezel area B/A and the pixel area A/A are described.

The flexible encapsulation unit 130 according to an exemplary embodiment of the present disclosure includes a first inorganic encapsulation layer 131, a first foreign matter compensation layer 137, a second foreign matter compensation layer 133, and a second inorganic encapsulation layer 132. Although the terms "first", "second", and the like are used for describing various components, these components are not confined by these terms.

The first inorganic encapsulation layer 131 is disposed to cover the pixel area A/A and the bezel area B/A. The first inorganic encapsulation layer 131 is formed of a transparent inorganic material which may be deposited at a low temperature. For example, the first inorganic encapsulation layer 131 is made of an inorganic material such as silicon nitride ($SiN_x$), aluminum oxide ($Al_2O_3$), silicon oxide ($SiO_x$), and silicon oxynitride (SiON). However, the first inorganic encapsulation layer 131 is not limited to the aforementioned materials of the first inorganic encapsulation layer 131. The first inorganic encapsulation layer 131 is conformally configured to cover the organic light emitting element 140.

The first inorganic encapsulation layer 131 may be deposited by one deposition method of a chemical vapor deposition (CVD) method and an atomic layer deposition (ALD) method.

The chemical vapor deposition method has an advantage of forming a thickness of the first inorganic encapsulation layer 131 to be relatively large within a shorter time than the ALD method. For example, the first inorganic encapsulation layer 131 may be formed of silicon nitride deposited by the chemical vapor deposition method. In this case, a deposition rate (DR) may be 200 nm/min and silicon nitride with a thickness of 1 μm may be formed during deposition for 5 minutes. A moisture permeation rate (WVTR) of the first inorganic encapsulation layer 131 deposited by the chemical vapor deposition method may achieve about $10^{-2}$ g/m²/day. However, the present disclosure is not limited thereto, and the first inorganic encapsulation layer 131 may be formed so as to have a thickness of 5,000 Å to 15,000 Å.

The deposition time of the ALD method is relatively slower than that of the chemical vapor deposition method, but the density of the first inorganic encapsulation layer 131 is relatively high. In addition, the ALD method has an advantage of achieving excellent step coverage performance with the very small thickness. Particularly, an organic material based foreign matter may be generated on the cathode 143. In this case, since the first inorganic encapsulation layer 131 formed by the ALD method may compensate and cover the cathode 143 and the foreign matter which are formed along the step between the bank 144 and the spacer 145, the ALD method could be more advantageous in significantly reducing cracks and seams than the chemical vapor deposition method. For example, the first inorganic encapsulation layer 131 may be formed of aluminum oxide deposited by the chemical vapor deposition method. In this case, the DR may be 5 nm/min, and aluminum oxide with a thickness of 0.1 μm may be formed during deposition for 20 minutes. Particularly, according to the ALD method, an atomic ratio of oxygen and aluminum may be controlled to be stably maintained. The moisture permeation rate (WVTR) of the first inorganic encapsulation layer 131 deposited by the ALD method may achieve about $10^{-3}$ (g/m²/day). The first inorganic encapsulation layer 131 may also be formed to have a thickness of 200 Å to 1,500 Å. When the first inorganic encapsulation layer 131 is made of aluminum oxide deposited by the ALD method, the first inorganic encapsulation layer 131 is formed with a thickness of 1,500 Å or less to achieve excellent bending performance.

The first inorganic encapsulation layer 131 may need to be deposited at 110° C. or less regardless of the deposition method to reduce or prevent the organic light emitting element 140 from being damaged by heat.

According to the aforementioned configuration, the first inorganic encapsulation layer 131 may have excellent performance for delaying moisture/oxygen permeation. Further, according to the aforementioned configuration, the first inorganic encapsulation layer 131 may achieve transmittance of visible light of 90% or more.

The first foreign matter compensation layer 137 is on the first inorganic encapsulation layer 131 to cover the pixel area A/A and a portion of the bezel area B/A. An end of the first foreign matter compensation layer 137 is positioned more inside than the end of the first inorganic encapsulation layer 131.

The first foreign matter compensation layer 137 which may be called as a buffer layer is made of flowable silicon oxycarbon (SiOC). Here, the first foreign matter compensation layer 137 has a feature of conformally compensating the foreign matter. For example, the carbon content of the first foreign matter compensation layer 137 can be configured in a range of 30% to 50%. The carbon content in the range may be defined by silicon oxycarbon having a high carbon content. That is, silicon oxycarbon having the high carbon content in the range may act as a buffer layer. Having the carbon content within the range, the hardness of the first foreign matter compensation layer 137 may be between 1 H to 2 H. According to the configuration, the first foreign matter compensation layer 137 may compensate the foreign matter generated in the first inorganic encapsulation layer 131 and may be easily deformed. In the present disclosure, compensating the foreign matter means that in an area with a sharp (or prominent) step and/or angle due to the foreign matter is covered to be gentle or covered to be less prominent. That is, the first foreign matter compensation layer 137 may compensate cracks and seams generated by the foreign matter. The thickness of the first foreign matter compensation layer 137 may be configured to 1 μm to 2 μm.

A second foreign matter compensation layer 133 is on the first foreign matter compensation layer 137 to cover the pixel area A/A and a portion of the bezel area B/A. Referring to FIG. 1B, the second foreign matter compensation layer 133 is illustrated as a form of covering the end of the first foreign matter compensation layer 137, but is not limited to the aforementioned form of the end. That is, the end of the second foreign matter compensation layer 133 and the end of the first foreign matter compensation layer 137 may also be positioned on the same vertical line.

The second foreign matter compensation layer 133 is made of dense silicon oxycarbon. For example, the carbon content of the second foreign matter compensation layer 133 is configured in a range of 5% to 30%. The carbon content in the range may be defined by silicon oxycarbon having a low carbon content. In addition, the silicon oxycarbon having the low carbon content in the aforementioned range may be called a protective layer. In the case of the carbon content in the aforementioned range, the hardness of the second foreign matter compensation layer 133 may be 3 H to 5 H. That is, the carbon content of the first foreign matter compensation layer 137 is larger than the carbon content of the second foreign matter compensation layer 133, and thus, the hardness of the second foreign matter compensation layer 133 is larger than that of the first foreign matter compensation layer 137. According to the aforementioned configuration, the second foreign matter compensation layer 133 may protect the first foreign matter compensation layer 137 from being deformed by plasma damage generated in a process of forming a second inorganic encapsulation layer 132. Further, the second foreign matter compensation layer 133 may improve a permeation delay degree for moisture/oxygen permeated to the organic light emitting element 140.

The thickness of the second foreign matter compensation layer 133 may be configured to 1 µm to 3 µm. Accordingly, a sum of the thickness of the second foreign matter compensation layer 133 and the thickness of the first foreign matter compensation layer 137 may be configured to 2 µm to 6 µm. For example, the sum of the thickness of the second foreign matter compensation layer 133 and the thickness of the first foreign matter compensation layer 137 is configured to 3 µm.

A ratio of the thickness of the second foreign matter compensation layer 133 and the thickness of the first foreign matter compensation layer 137 is configured to be 1:2 to 4:1. Particularly, when the ratio of thicknesses of the first foreign matter compensation layer 137 and the second foreign matter compensation layer 133 is beyond the aforementioned ratio, failures may occur. In detail, when the first foreign matter compensation layer 137 is formed to be too thin, the foreign matter may not be sufficiently compensated. When the second foreign matter compensation layer 133 is formed to be too thin, deformations on the surface of the first foreign matter compensation layer 137 may be generated by plasma when forming the second inorganic encapsulation layer 132. In addition, an out-gassing problem may be caused in the first foreign matter compensation layer 137. Thus, a problem in the reliability of the first foreign matter compensation layer 137 may be caused. Accordingly, within the aforementioned thickness ratio, the first foreign matter compensation layer 137 and the second foreign matter compensation layer 133 are desired to be configured.

While the first foreign matter compensation layer 137 and the second foreign matter compensation layer 133 efficiently compensate the foreign matter, in order to minimize deformation failure possibility, the thicknesses of the first foreign matter compensation layer 137 made of the flowable silicon oxycarbon and the second foreign matter compensation layer 133 made of the dense silicon oxycarbon may be maintained with a predetermined ratio. The first foreign matter compensation layer 137 and the second foreign matter compensation layer 133 which are the plurality of foreign matter compensation layers have an interface therebetween. In order to form the interface, after the first foreign matter compensation layer 137 is deposited, deposition of silicon oxycarbon may need to be paused for a predetermined time period. For example, after the first foreign matter compensation layer 137 is deposited, the deposition process may need to stop in a deposition chamber for 30 seconds to 3 minutes. When the deposition of silicon oxycarbon starts again after the deposition stops, the interface is formed between the first foreign matter compensation layer 137 and the second foreign matter compensation layer 133. The interface formed by the deposition process partitions the first foreign matter compensation layer 137 and the second foreign matter compensation layer 133 which are adjacent to each other regardless of the carbon content. According to the configuration, since the permeated moisture is dispersed along the interface, a moisture permeation path is lengthened. In addition, there is an advantage in that surface curing treatment is selectively performed on each interface. In addition, as compared with thickly forming the foreign matter compensation layer made of flowable silicon oxycarbon as a single layer, when a plurality of layers made of flowable silicon oxycarbon is formed with small thickness, more interfaces may exist. When a length of the moisture permeation path is increased, the performance for delaying moisture permeation of the flexible encapsulation unit 130 is improved. In detail, since the first foreign matter compensation layer 137 has relatively lower hardness than that of the protective layer and is the flowable buffer layer, the first foreign matter compensation layer 137 may be easily deformed by the plasma damage. The deformation means that the surface becomes uneven or haze is generated. Particularly, since the deformation of the first foreign matter compensation layer 137 generates step differences of the surface, the cracks and the seams may be caused in the second inorganic encapsulation layer 132. Accordingly, the surface of the first foreign matter compensation layer 137 may be cured by additional thermoset treatment or oxygen plasma treatment. When the surfaces of the first foreign matter compensation layer 137 and the second foreign matter compensation layer 133 are cured, flowability of the surface is reduced. In addition, viscosity of the cured surfaces of the first foreign matter compensation layer 137 and the second foreign matter compensation layer 133 is reduced, and a surface failure caused due to plasma damage or a high temperature may be reduced. According to the aforementioned configuration, the deformation of the first foreign matter compensation layer 137 may be reduced. Further, the performance for delaying moisture permeation is improved by the surface-curing treated surface of the flowable first foreign matter compensation layer 137.

For example, oxygen plasma treatment may be performed at a temperature of 50° C. for 10 seconds. However, like the second foreign matter compensation layer 133, silicon oxycarbon layer has relatively higher hardness than the buffer layer and its density may not require an additional surface treatment.

The first foreign matter compensation layer 137 and the second foreign matter compensation layer 133 made of silicon oxycarbon according to an exemplary embodiment of the present disclosure will be described in summary. Hereinafter, for convenience of description, the first foreign matter compensation layer 137 and the second foreign matter compensation layer 133 may be called as a silicon oxycarbon layer.

First, as the carbon content of the silicon oxycarbon layer is increased, flowability of the silicon oxycarbon layer gets gradually better. As the flowability gets better, the silicon oxycarbon layer has a characteristic close to an organic material and the hardness thereof is decreased. Accordingly, the silicon oxycarbon layer has an advantage of compensating the foreign matter. Further, the viscosity is generated on the surface of the silicon oxycarbon layer. The flowable silicon oxycarbon layers are configured to be protected by the dense silicon oxycarbon layer so that the surface failure may not be generated.

Second, when the plurality of silicon oxycarbon layers is continuously deposited, if the deposition of silicon oxycarbon stops for the predetermined period, an interface between the silicon oxycarbon layers is formed. In addition, moisture tends to be permeated along the interface. Accordingly, the moisture permeation path may be lengthened.

Third, the surface of the flowable silicon oxycarbon layer may be selectively surface-curing treated. When the surface is cured, the flowability of the surface is reduced. Accordingly, the viscosity of the cured surface of the silicon oxycarbon layer is reduced, and the surface failure due to plasma damage or the high temperature may be reduced. Further, the performance for delaying moisture permeation of the cured surface of the silicon oxycarbon layer may be improved.

Fourth, as the carbon content of the silicon oxycarbon layer is decreased, flowability of the silicon oxycarbon layer tends to be gradually decreased. As the flowability is decreased, the silicon oxycarbon layer has a characteristic close to an inorganic material and the hardness thereof is increased. Accordingly, the silicon oxycarbon layer has a protective layer characteristic. The protective layer characteristic is configured to protect the flowable silicon oxycarbon layer from the plasma damage generated when the second inorganic encapsulation layer 132 is formed. That is, the first foreign matter compensation layer 137 may be protected from the plasma damage generated by the second foreign matter compensation layer 133 when the second inorganic encapsulation layer 132 is formed.

Fifth, when a plurality of silicon oxycarbon layers having various characteristics is formed, the plurality of silicon oxycarbon layers may be formed by changing only a condition of a ratio of gas in the chamber, a temperature of the chamber, pressure, and the like. Accordingly, the flexible organic light emitting display device 100 may not need be transferred to another chamber, use other equipment, or the like. That is, since a continuous deposition process may be easily performed and a possibility of generation of additional foreign matters is significantly lowered, it is advantageous that mass productivity and high yield would be achieved. In this case, since the foreign matter compensation degree of the silicon oxycarbon layer is improved as a silicon process temperature is lowered, the deposition process temperature of the first foreign matter compensation layer 137 may be controlled to be lower than the deposition process temperature of the second foreign matter compensation layer 133.

Hereinafter, a method of forming the first foreign matter compensation layer 137 and the second foreign matter compensation layer 133 according to an embodiment of the present disclosure will be described in detail.

The first foreign matter compensation layer 137 and the second foreign matter compensation layer 133 are formed by a chemical vapor deposition (CVD) method, a plasma-enhanced chemical vapor deposition (PECVD) method, or a hexamethyldisiloxane (HMDSO-) chemical vapor deposition (H-CVD) method. The first foreign matter compensation layer 137 and the second foreign matter compensation layer 133 may be deposited by the deposition at a speed of 1.3 μm/min or higher.

The first foreign matter compensation layer 137 and the second foreign matter compensation layer 133 are formed by reaction of a material such as hexamethyldisiloxane (HMDSO), tetramethyldisiloxane (TMDSO), trimethylmethoxysilane (TMMOS), bistrimetylsilylmethane (BTMSM), tetraethoxysilane (TEOS), divinyltetramethyl disiloxane (DVTMDSO), and octamethylcyclotetrasiloxane (OMCATS) and gas.

For example, referring to Chemical Formula 1 shown below, when the first foreign matter compensation layer 137 and the second foreign matter compensation layer 133 are made of HMDSO, gas of a Si—O—CH component and oxygen ($O_2$) serving as reaction gas are injected into the chamber. In this case, the carbon content may be set by controlling the process temperature, the process pressure, and/or a flow of oxygen. In the case, the generated moisture ($H_2O$) is a minute amount, but such may still damage the organic light emitting element 140. However, since the first inorganic encapsulation layer 131 is configured to encapsulate the organic light emitting element 140, the damage of the organic light emitting element 140 due to moisture may be sufficiently suppressed. Further, carbon dioxide may be removed by using a wet scrubber and/or a dry pump in the chamber. In this case, in order to evaporate moisture generated when oxygen reacts with HMDSO, a temperature in the chamber is controlled to be 30° C. to 110° C.

In addition, according to Chemical Formula 1, silicon oxycarbon includes hydrogen, but in the flexible organic light emitting display device 100 according to an exemplary embodiment of the present disclosure, since the carbon content is mainly controlled, for convenience of description, the description of hydrogen will be omitted merely for avoiding redundancy.

[Chemical Formula 1]

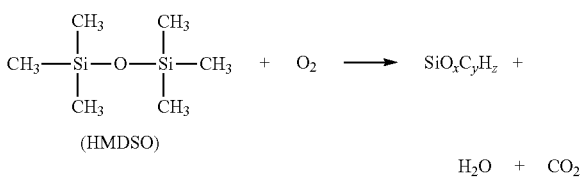

The second inorganic encapsulation layer 132 is disposed to cover the pixel area A/A and the bezel area B/A. The second inorganic encapsulation layer 132 is formed of a transparent inorganic material which may be deposited at a low temperature. The second inorganic encapsulation layer 132 is made of an inorganic material such as silicon nitride (SiNx), aluminum oxide ($Al_2O_3$), silicon oxide (SiOx), and silicon oxynitride (SiON). However, the second inorganic encapsulation layer 132 is not limited to the aforementioned materials of the second inorganic encapsulation layer 132.

The second inorganic encapsulation layer 132 may be deposited by a chemical vapor deposition method or an atomic layer deposition (ALD) method. Since a manufacturing method, a material, and thickness of the second inorganic encapsulation layer 132 are the same as those of the first inorganic encapsulation layer 131, the duplicated description will be omitted merely for avoiding redundancy.

The end of the second inorganic encapsulation layer 132 is positioned more outside than the ends of the first foreign matter compensation layer 137 and the second foreign matter compensation layer 133. Accordingly, the second inorganic encapsulation layer 132 encapsulates the first foreign matter compensation layer 137 and the second foreign matter compensation layer 133, while contacting the first inorganic encapsulation layer 131 in the bezel area B/A. That is, the first inorganic encapsulation layer 131 and the second inorganic encapsulation layer 132 encapsulate the plurality of foreign matter compensation layers 133 and 137.

A width of a cross section in which the first inorganic encapsulation layer 131 and the second inorganic encapsulation layer 132 contact and encapsulate the first foreign matter compensation layer 137 and the second foreign matter compensation layer 133 may be formed to 50 μm to 500 μm, and for example, 300 μm. According to the aforementioned configuration, the first inorganic encapsulation layer 131 and the second inorganic encapsulation layer 132 are configured to encapsulate the first foreign matter compensation layer 137 and the second foreign matter compensation layer 133. Thus, a direct moisture permeation path through the first foreign matter compensation layer 137 and the second foreign matter compensation layer 133 is blocked or sealed.

The second inorganic encapsulation layer 132 is deposited at the low temperature to suppress the damage to the organic light emitting element 140. In addition, the second inorganic encapsulation layer 132 may have excellent moisture permeation rate. Further, the second inorganic encapsulation layer 132 may achieve transmittance of visible light of 90% or more. Particularly, the second inorganic encapsulation layer 132 has an advantage of forming an encapsulation layer with significantly reduced possibility of cracks and seams. Such a reduced possibility is due to foreign matter being effectively compensated by the first foreign matter compensation layer 137 and the second foreign matter compensation layer 133.

Figure 1C:
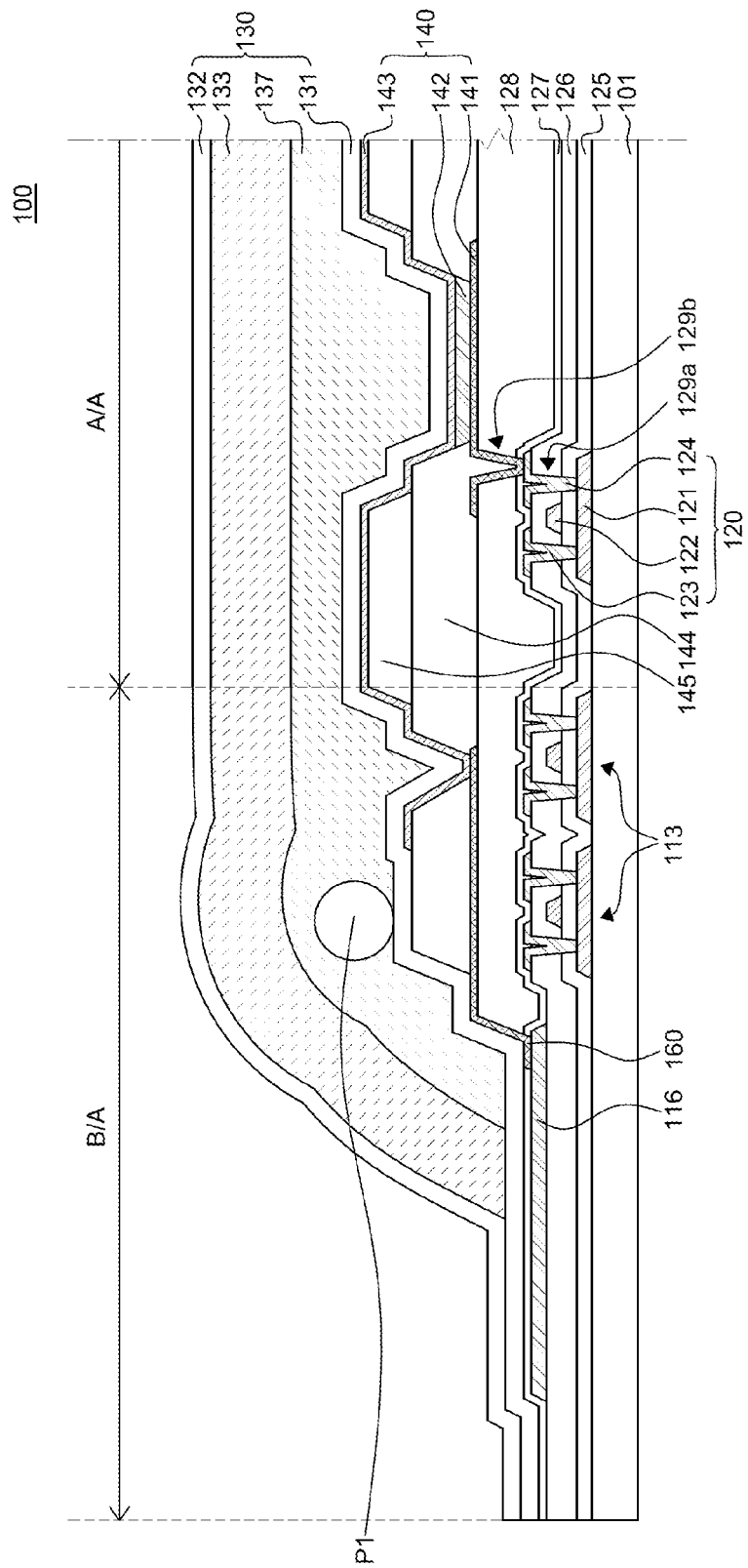
FIG. 1C is a schematic cross-sectional view for describing that foreign matters are compensated in a flexible organic light emitting display device according to an exemplary embodiment of the present disclosure.

FIG. 1C is a schematic cross-sectional view for describing that foreign matters are compensated in the flexible organic light emitting display device according to an exemplary embodiment of the present disclosure.

Referring to FIG. 1C, a case where a foreign matter P1 is compensated by the first foreign matter compensation layer 137 and the second foreign matter compensation layer 133 according to an exemplary embodiment of the present disclosure is illustrated. Since the first foreign matter compensation layer 137 is flowable, the first foreign matter compensation layer 137 conformally covers the foreign matter P1 to effectively compensate the foreign matter P1. In addition, the second foreign matter compensation layer 133 covers the first foreign matter compensation layer 137. Accordingly, the foreign matter P1 may be further compensated. Particularly, the compensation of the foreign matter P1 may mean that the second inorganic encapsulation layer 132 may reduce a step or unevenness due to the foreign matter P1 so that seams or cracks may not be generated.

In some exemplary embodiments, a capping layer may be on the cathode 143. The capping layer does not have an electric effect on the cathode 143 and may be made of an organic material or an inorganic material, and acts as a layer capable of improving light efficiency and a viewing angle.

Figure 2:
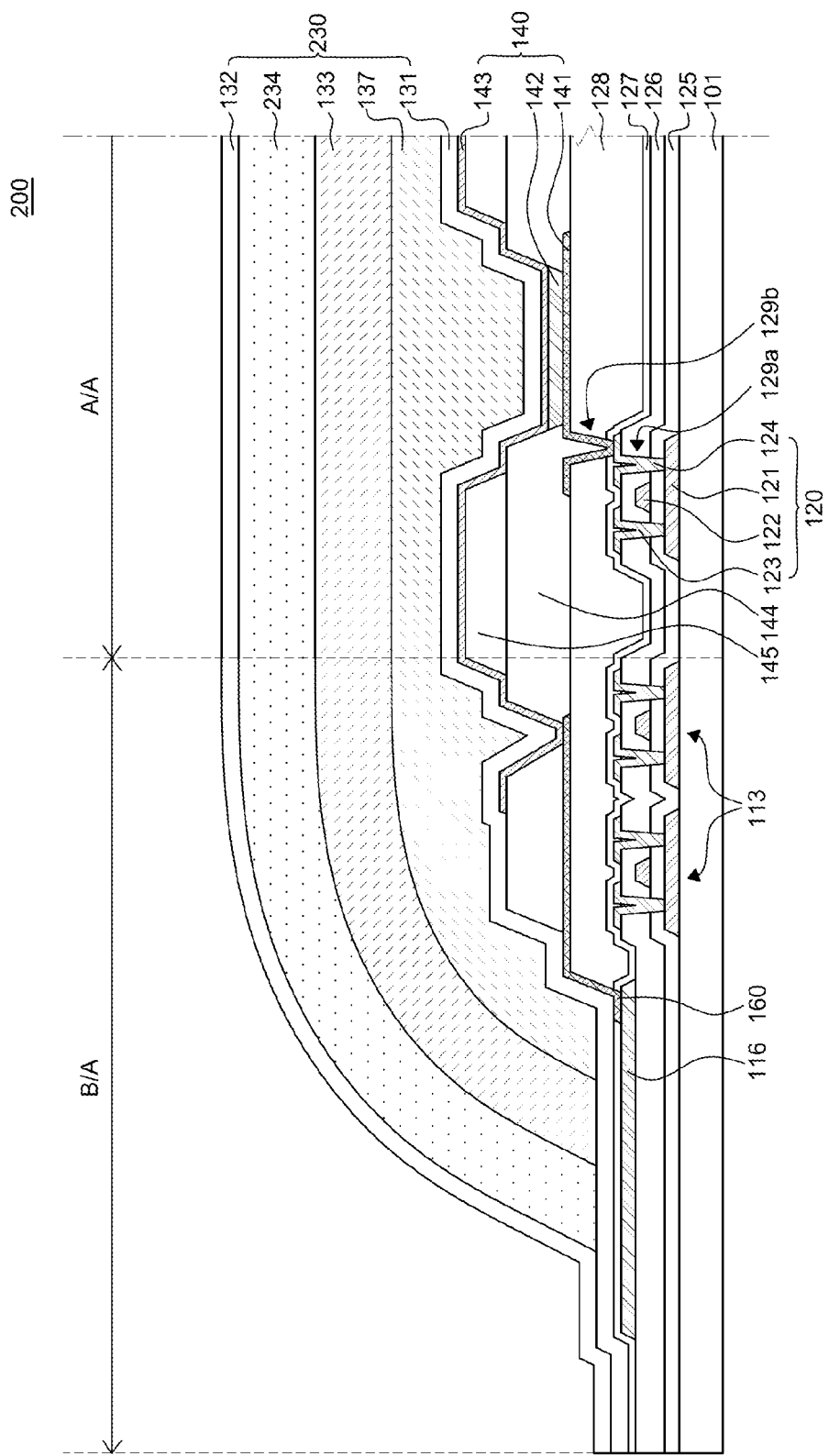
FIG. 2 is a schematic cross-sectional view of a flexible organic light emitting display device according to another exemplary embodiment of the present disclosure.

FIG. 2 is a schematic cross-sectional view of a flexible organic light emitting display device according to another exemplary embodiment of the present disclosure. A flexible organic light emitting display device 200 illustrated in FIG. 2 further includes a planarization foreign matter compensation layer 234 on foreign matter compensation layers formed by a chemical vapor deposition method as compared with the flexible organic light emitting display device 100 illustrated in FIGS. 1A to 1C. Hereinafter, for convenience of description, any duplicated description will be omitted merely for avoiding redundancy.

The planarization foreign matter compensation layer 234 is disposed in a portion of the bezel area B/A and the pixel area A/A between the foreign matter compensation layers 133 and 137 formed by the chemical vapor deposition method and the second inorganic encapsulation layer 132. The planarization foreign matter compensation layer 234 is made of an acrylic or epoxy based resin. The planarization foreign matter compensation layer 234 is formed through, for example, screen printing or an inkjet process. Particularly, the planarization foreign matter compensation layer 234 is not limited thereto, but is formed with a thickness of 3 μm to 10 μm. For example, the planarization foreign matter compensation layer 234 is formed with a thickness of 5 μm. When the thickness of the planarization foreign matter compensation layer 234 is 3 μm or less, a non-coated area causing pin holes may be generated during the screen printing process. When the thickness thereof is 10 μm or more, a target critical radius of curvature of for example, 10 R or less may not be achieved (e.g., when the thickness of the planarization foreign matter compensation layer 234 is too thick, a tensile stress or a compressive stress at any one of the inorganic encapsulation layers is increased upon bending).

The epoxy based resin may use bisphenol-A-epoxy with high viscosity, bisphenol-F-epoxy with low viscosity, or the like. The planarization foreign matter compensation layer 234 may further include an additive. For example, in order to improve uniformity of the resin, a wetting agent for reducing surface tension of the resin, a leveling agent for improving surface flatness of the resin, and a defoaming agent for removing air bubbles included in the resin may be further added as the additives. The planarization foreign matter compensation layer 234 may further include an initiator. For example, an antimony based initiator or an anhydride based initiator for curing a liquid resin by initiating a chain reaction by heat may be used.

Particularly, in the case of thermally curing the resin, it is important to control the process temperature to 110° C. or less. If the resin is thermally cured at a process temperature of 120° C. or more, the pre-formed organic light emission layer 142 may be damaged. Accordingly, the resin which is cured at 110° C. or less is used.

For example, the foreign matter compensation layers 133 and 137 formed by the chemical vapor deposition method protect the cathode 143 and the bank 144 from being damaged when the planarization foreign matter compensation layer 234 is formed by a screen printing process. Particularly, because the screen printing process employs a process of physically applying pressure, physical damage may be generated. However, such a possible physical damage may be minimized or avoided due to protection offered by the foreign matter compensation layers 133 and 137 formed by the chemical vapor deposition method.

The flexible organic light emitting display device 200 should have a small thickness so as to have a lower critical radius of curvature. Particularly, in the case where there are no foreign matter compensation layers formed by the chemical vapor deposition method, in order to suppress damage, the thickness of the planarization foreign matter compensation layer formed by the screen printing process may be increased. However, according to the aforementioned structure, since the thickness of the planarization foreign matter compensation layer 234 may be decreased, the flexible organic light emitting display device 200 having a lower critical radius of curvature may be achieved. In detail, when the planarization foreign matter compensation layer 234 is formed with a thickness of 10 μm or less by using the screen printing process, a problem in that the organic light emitting element 140 is damaged by a screen printing mask having a mesh pattern used in a squeegee process may occur.

As a result, in the flexible organic light emitting display device 200 according to another exemplary embodiment of the present disclosure, at least one foreign matter compensation layer formed by the chemical vapor deposition method is disposed below the planarization foreign matter compensation layer 234 to implement the planarization foreign matter compensation layer 234 with small thickness substantially without damaging the organic light emitting element. Further, when the foreign matter compensation layers 133 and 137 are disposed below the planarization foreign matter compensation layer 234, the planarization foreign matter compensation layer 234 may be formed with a thickness of 10 μm or less. Furthermore, since the thicknesses of the foreign matter compensation layers 133 and 137 are 2 μm or less, even though the foreign matter compensation layers 133 and 137 and the planarization foreign matter compensation layer 234 all are formed, the first foreign matter compensation layer 137, the second foreign matter compensation layer 133, and the planarization foreign matter compensation layer 234 may be formed with a thickness of smaller than 20 μm. Accordingly, since the thinner flexible organic light emitting display device 200 is to be implemented, the critical radius of curvature of the flexible organic light emitting display device 200 may be reduced.

The transparent flexible encapsulation unit 230 according to another exemplary embodiment of the present disclosure forms the planarization foreign matter compensation layer 234 by using screen printing by the aforementioned foreign matter compensation layers 133 and 137. However, a transparent flexible encapsulation unit 230 which is thinner than the related art may be implemented substantially without damaging the organic light emitting element 140. Accordingly, excellent performance for delaying moisture permeation and excellent flexibility may be achieved.

Figure 3A:
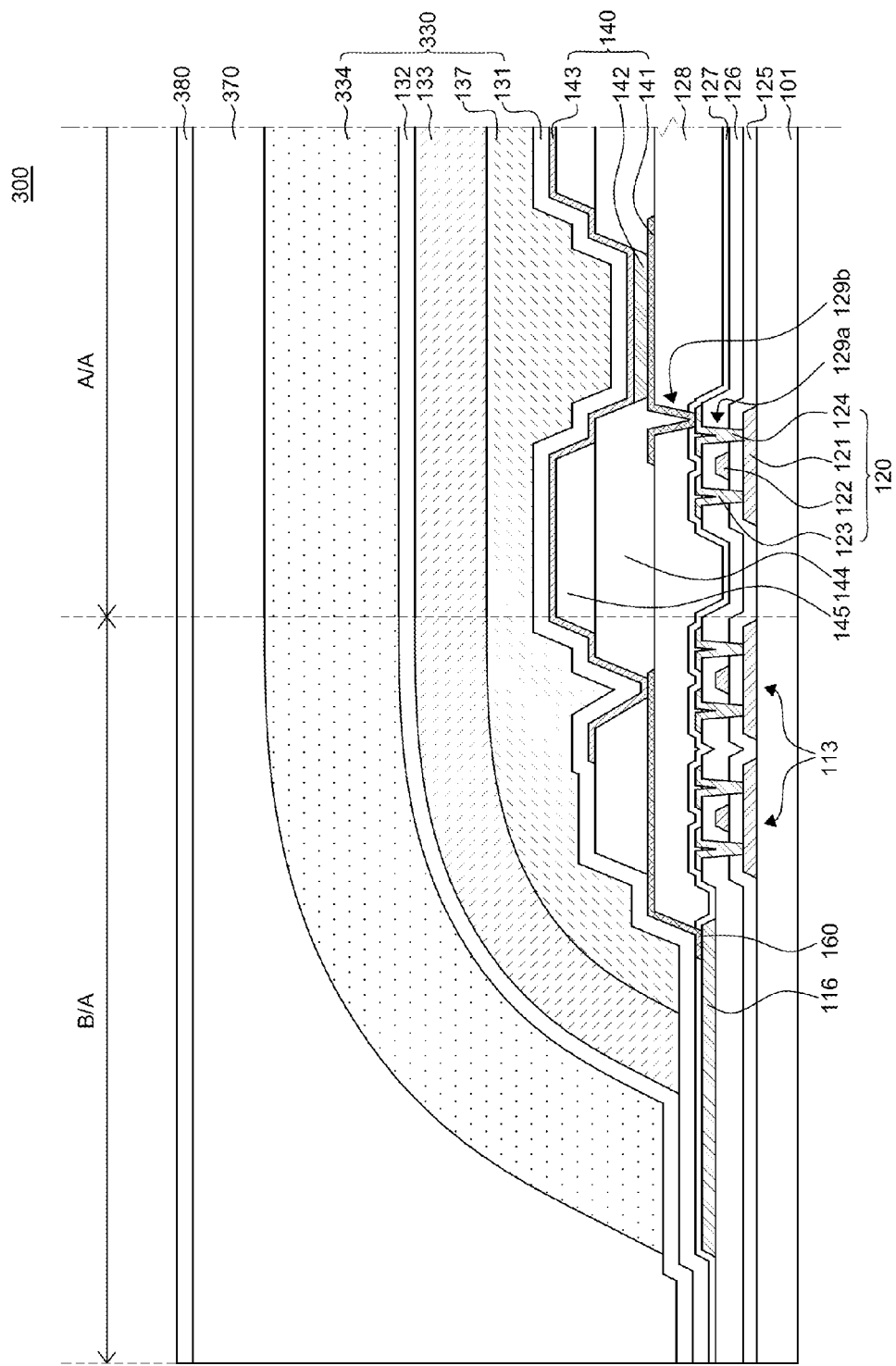
FIG. 3A is a schematic cross-sectional view of a flexible organic light emitting display device according to yet another exemplary embodiment of the present disclosure.

FIG. 3A is a schematic cross-sectional view of a flexible organic light emitting display device according to yet another exemplary embodiment of the present disclosure. A flexible organic light emitting display device 300 illustrated in FIG. 3A further includes a planarization foreign matter compensation layer 334, a pressure sensitive adhesive layer 370, and a barrier film 380 as compared with the flexible organic light emitting display device 100 illustrated in FIGS. 1A to 1C. Hereinafter, for convenience of description, any duplicated description will be omitted merely for avoiding redundancy.

The planarization foreign matter compensation layer 334 is on the second inorganic encapsulation layer 132 in a portion of the bezel area B/A and the pixel area A/A. That is, the planarization foreign matter compensation layer 334 is configured to planarize (or even out) the top of the second inorganic encapsulation layer 132. An end of the planarization foreign matter compensation layer 334 is configured to be positioned more inside than the end of the second inorganic encapsulation layer 132. The planarization foreign matter compensation layer 334 is made of an acryl resin, an epoxy resin, or a silicon resin. The planarization foreign matter compensation layer 334 is formed to have a thickness of 10 μm or less.

The planarization foreign matter compensation layer 334 may reduce piercing, imprinting, or punching failures, which may be generated when the foreign matter is disposed below the planarization foreign matter compensation layer 334. The reduction of piercing, imprinting, or punching failure caused by the planarization foreign matter compensation layer 334 will be described in detail with reference to FIG. 3B.

Referring to FIG. 3A, the barrier film 380 faces a lower substrate 101. The barrier film 380 may additionally block oxygen and moisture from being permeated to the flexible organic light emitting display device 300 together with the flexible encapsulation unit 330. For example, the barrier film 380 may be made of any one material among copolyester thermoplastic elastomer (COP), cycoolefin copolymer (COC), and polycarbonate (PC), but is not limited thereto.

Referring to FIG. 3A, the pressure sensitive adhesive layer 370 is positioned between the flexible encapsulation unit 330 and the barrier film 380. The pressure sensitive adhesive layer 370 is disposed on the bottom of the barrier film 380 to adhere to the planarization foreign matter compensation layer 334. That is, the pressure sensitive adhesive layer 370 is disposed to contact the entire bottom of the barrier film 380 and disposed in both the pixel area A/A and the bezel area B/A. The pressure sensitive adhesive layer 370 is configured in a film form having transmittance and double-sided adhesion. Particularly, the pressure sensitive adhesive layer 370 may be formed of a material having a characteristic in which adhesion is increased when predetermined pressure is applied. For example, the pressure sensitive adhesive layer 370 may be formed of any type of insulating material, such as olefin based, acryl based, and silicon based materials, but is not limited thereto.

Hereinafter, effects of the flexible organic light emitting display device 300 according to yet another exemplary embodiment of the present disclosure will be described in more detail with reference to FIG. 3B.

Figure 3B:
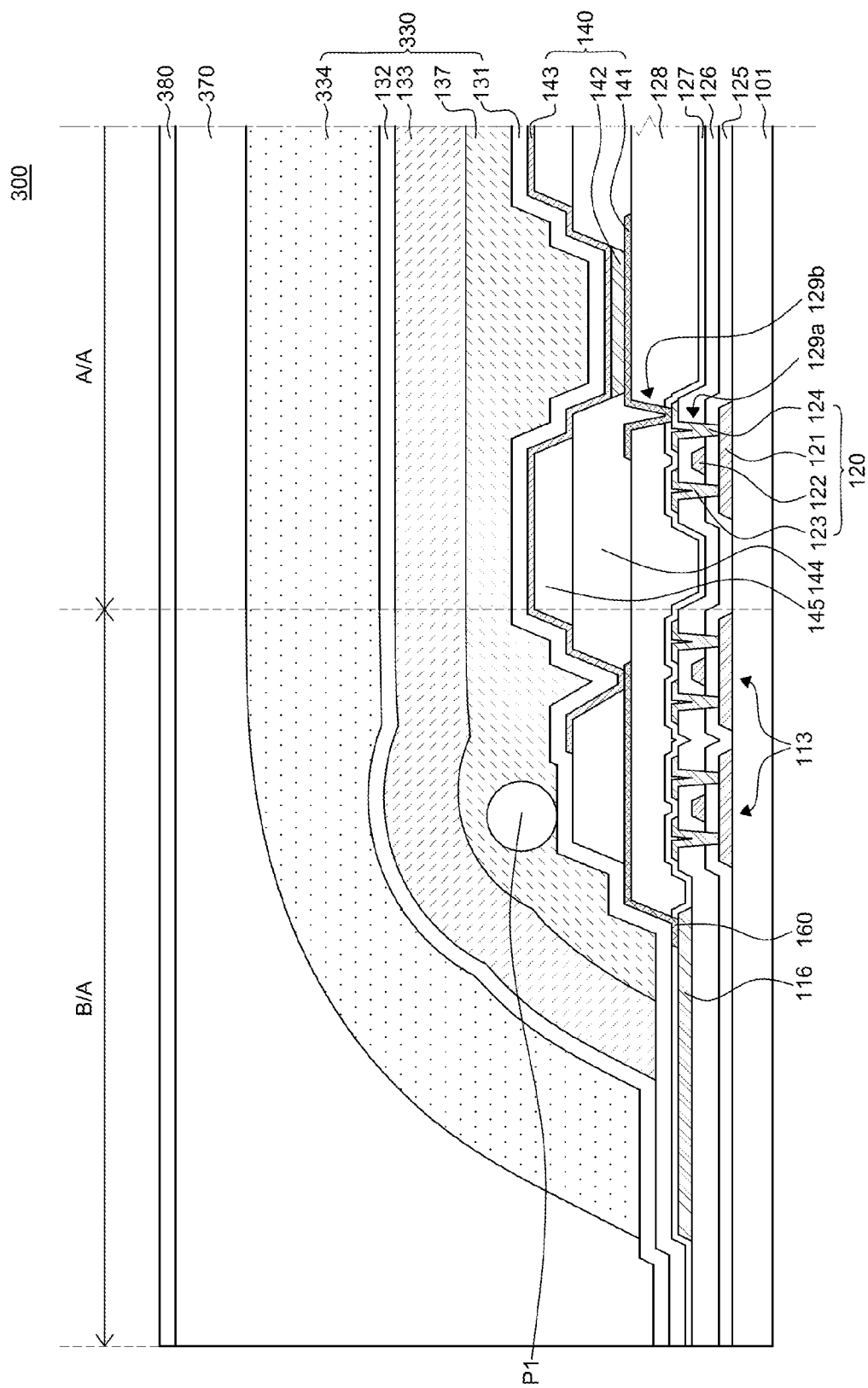
FIG. 3B is a schematic cross-sectional view for describing that foreign matters are disposed at an inside of a flexible organic light emitting display device according to yet another exemplary embodiment of the present disclosure.

FIG. 3B is a schematic cross-sectional view for describing that foreign matters are disposed at the inside of the flexible organic light emitting display device according to yet another exemplary embodiment of the present disclosure. In FIG. 3B, a case where a foreign matter P1 is disposed between the first inorganic encapsulation layer 131 and the first foreign matter compensation layer 137 of the flexible organic light emitting display device 300 illustrated in FIG. 3A is illustrated.

Since the barrier film 380 may easily adhere through a bonding process, the overall process time, costs, and the like are relatively decreased as compared with forming the encapsulation layer by the deposition process. As such, the barrier film 380 can be additionally attached on the second inorganic encapsulation layer 132 to additionally increase encapsulation performance of the flexible organic light emitting display device 300.

As illustrated in FIG. 3B, while the foreign matter P1 is on the first inorganic encapsulation layer 131, the first foreign matter compensation layer 137 and the second foreign matter compensation layer 133. As described in FIG. 1C, even though the second inorganic encapsulation layer 132 compensates for the foreign matter P1 by the first foreign matter compensation layer 137 and the second foreign matter compensation layer 133, the second inorganic encapsulation layer 132 may still show an irregularity due to the foreign matter P1.

As illustrated in FIG. 3B, the second inorganic encapsulation layer 132 having such an irregularity (step region) due to the foreign matter P1 may exist.

In the flexible organic light emitting display device 300 according to yet another exemplary embodiment of the present disclosure, the second inorganic encapsulation layer 132 formed on the first foreign matter compensation layer 137 may be made of an aluminum based material. For example, the second inorganic encapsulation layer 132 is made of aluminum oxide deposited by the ALD method. As a result, the second inorganic encapsulation layer 132 has excellent step coverage (or foreign matter compensation) performance with a very small thickness, for example, a thickness of 0.1 μm. Particularly, the second inorganic encapsulation layer 132 has relatively excellent step coverage performance as compared with the case where the second inorganic encapsulation layer 132 is made of a silicon based inorganic material (for example, $SiN_x$ or $SiO_x$). Accordingly, the second inorganic encapsulation layer 132 formed by the ALD method may cover the entire upper surface of the second inorganic encapsulation layer 132 to further compensate the foreign matter P1 below the second inorganic encapsulation layer 132.

Meanwhile, as illustrated in FIG. 3B, the first foreign matter compensation layer 137 and the second foreign matter compensation layer 133 conformally compensate the foreign matter P1 to reduce or alleviate the step (irregularity) problem. However, the second inorganic encapsulation layer 132 may have a portion protruding or bulging toward the barrier film 380 in an area corresponding to the foreign matter P1. As such, if the second inorganic encapsulation layer 132 has such a protrusion or bulge, there may be problems when the pressure sensitive adhesive layer 370 is disposed to contact the second inorganic encapsulation layer 132. Thereafter, the lower substrate 101 and the barrier film 380 are bonded to each other, and the piercing, imprinting, or punching phenomenon due to the foreign matter P1 may occur. In more detail, while the lower substrate 101 and the barrier film 380 are bonded to each other, physical pressure is applied from the upper portion of the barrier film 380. In addition, when the second inorganic encapsulation layer 132 on the foreign matter P1 has the protruding shape (caused by the foreign matter), the second inorganic encapsulation layer 132 or the first inorganic encapsulation layer 131 may be pierced or damaged by the pressure generated during bonding which is applied from the upper portion of the barrier film 380. As such, when the second inorganic encapsulation layer 132 or the first inorganic encapsulation layer 131 is pierced, a crack is generated in the second inorganic encapsulation layer 132 or the first inorganic encapsulation layer 131 and thus, moisture or oxygen may be easily permeated to the organic light emitting element 140. Further, when the lower substrate 101 and the barrier film 380 are bonded to each other, gas bubbles may be generated in the area having the protruding shape of the second inorganic encapsulation layer 132.

As a result, in the flexible organic light emitting display device 300 according to yet another exemplary embodiment of the present disclosure, the planarization foreign matter compensation layer 334 formed on the second inorganic encapsulation layer 132 is configured to planarize (i.e., smoothen or even out) the upper portion of the second inorganic encapsulation layer 132. That is, since the planarization foreign matter compensation layer 334 is made of an acryl resin, an epoxy resin, or a silicon resin, the planarization foreign matter compensation layer 334 may compensate for any step regions or unevenness of the protruding portion of the second inorganic encapsulation layer 132. In addition, as the foreign matter P1 is disposed below the planarization foreign matter compensation layer 334, generation of the piercing, imprinting, or punching failure and the gas/air bubbles which may be generated when the barrier film 380 is bonded may be effectively reduced. In addition, the features regarding the planarization foreign matter compensation layer 334 and the barrier film 380 may be combined with or adapted for other exemplary embodiments of the present disclosure.

In some exemplary embodiments, a touch panel may be included at the barrier film 380 or the touch panel may be included on the flexible encapsulation unit 330 instead of the barrier film 380. If the top of the organic light emitting element 140 is not planarized, undesired bubbles may be created when adhering the touch panel. Such a generation of problematic bubbles when adhering the touch panel may be reduced by properly planarizing the top of the organic light emitting element 140 through the flexible encapsulation unit 330.

Figure 4:
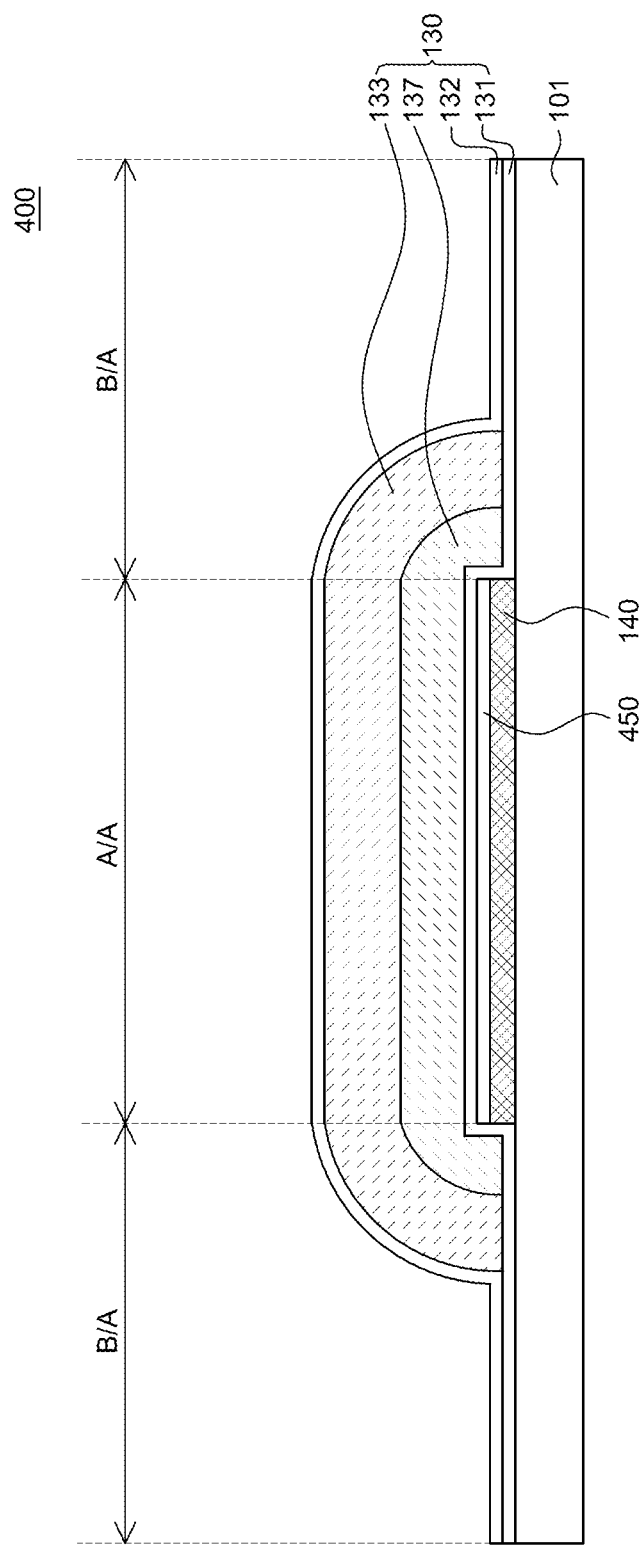
FIGS. 4 to 9 are schematic cross-sectional views of flexible organic light emitting display devices according to various exemplary embodiments of the present disclosure.

FIG. 4 is a schematic cross-sectional view of a flexible organic light emitting display device according to still another exemplary embodiment of the present disclosure. A flexible organic light emitting display device 400 illustrated in FIG. 4 further includes an anti-oxidation layer 450 as compared with the flexible organic light emitting display device 100 illustrated in FIGS. 1A to 1C. Hereinafter, for convenience of description, any duplicated description will be omitted merely for avoiding redundancy. In FIG. 4, for convenience of description, the organic light emitting element 140 is briefly illustrated, and constituent elements such as the thin film transistor 120 are omitted merely for avoiding redundancy.

The flexible organic light emitting display device 400 further includes the anti-oxidation layer 450 below the flexible encapsulation unit 130. In addition, the anti-oxidation layer 450 may be selectively applied to any or all exemplary embodiments of the present disclosure. The anti-oxidation layer 450 is configured to be disposed at the lower side of the first inorganic encapsulation layer 131. For example, the anti-oxidation layer 450 may be applied to the case where the first inorganic encapsulation layer 131 is aluminum oxide deposited by oxygen plasma through the ALD method.

The anti-oxidation layer 450 is configured to cover the organic light emitting element 140. In detail, the anti-oxidation layer 450 is configured to cover the cathode 143 of the organic light emitting element 140. In addition, the anti-oxidation layer 450 blocks oxygen plasma from being permeated through possible cracks in the cathode 143 to thus serve to protect the organic light emitting element 140 so as not to be oxidized by the oxygen plasma when the first inorganic encapsulation layer 131 is deposited.

The anti-oxidation layer 450 may need to be deposited by using an inert gas such as nitrogen ($N_2$), argon (Ar), or helium (He) so as not to oxidize the organic light emitting element 140. Accordingly, even if some cracks or other minute damage exists in the cathode 143, the organic light emitting element 140 is effectively prevented from being oxidized while forming the anti-oxidation layer 450. As the anti-oxidation layer 450 which may be formed of inert gas, for example, silicon nitride (SiNx) may be applied.

In addition, since the anti-oxidation layer 450 is to suppress oxidation of the organic light emitting element 140 through cracks or irregularities of the cathode 143 in a process where oxygen plasma is used, the anti-oxidation layer 450 may be formed to have a minimum thickness. For example, the anti-oxidation layer 450 may be formed with a thickness of 0.1 μm to 0.9 μm. Particularly, when the thickness of the anti-oxidation layer 450 is increased to 0.9 μm or more, flexibility is decreased and cracks or damage could be easily generated in the anti-oxidation layer 450. Accordingly, the thickness of the anti-oxidation layer 450 is configured to be minimum so that the oxidation of the organic light emitting element 140 may be suppressed by considering the flexible display device 400. Particularly, when the foreign matter compensation layer made of a material such as silicon oxycarbon is formed, the anti-oxidation layer 450 may more efficiently protect the organic light emitting element 140 during such a process.

Figure 5:
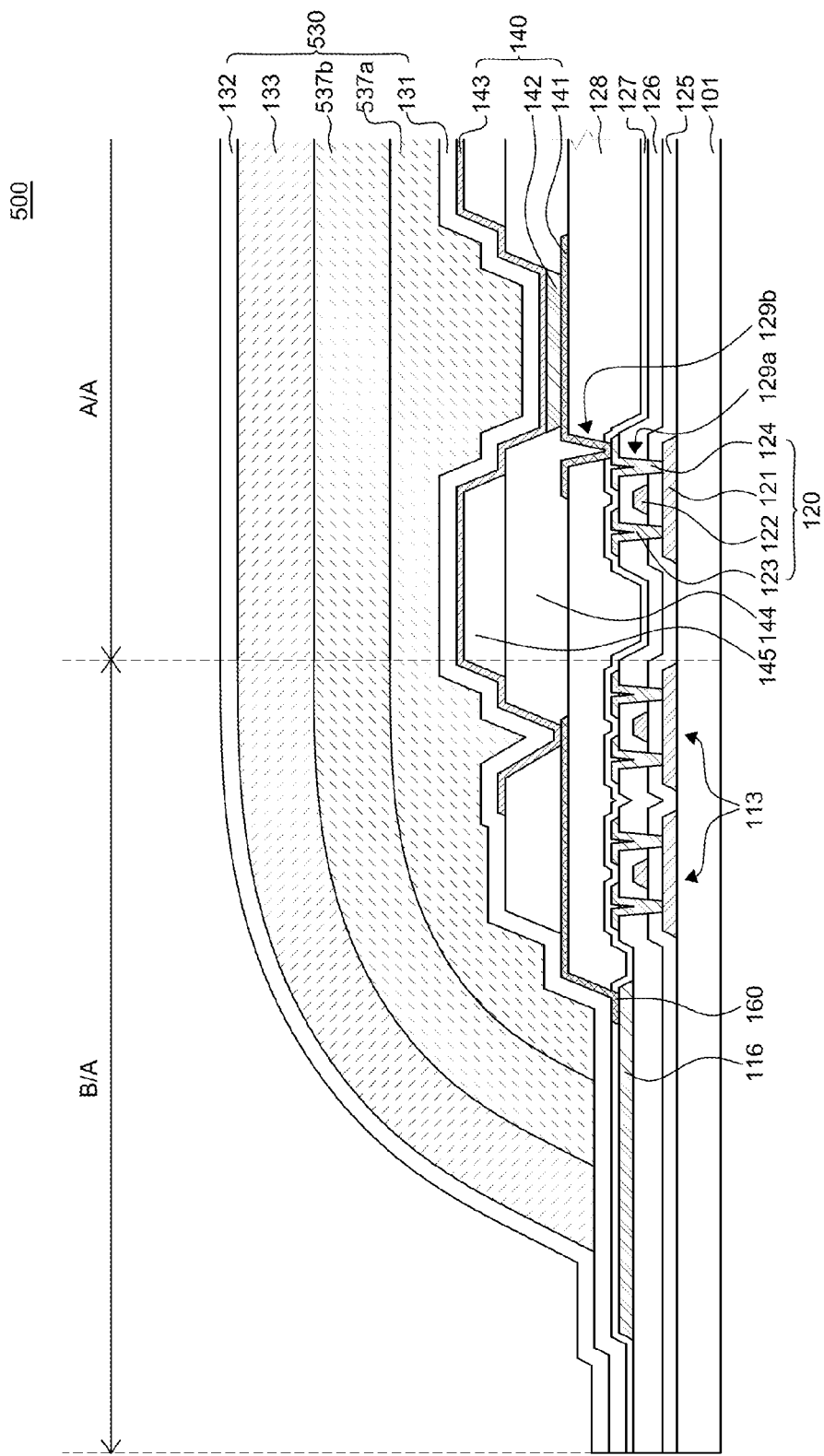

FIG. 5 is a schematic cross-sectional view of a flexible organic light emitting display device according to still another exemplary embodiment of the present disclosure. A flexible organic light emitting display device 500 illustrated in FIG. 5 is configured so that a first foreign matter compensation layer 137 further includes a first buffer layer 537a and a second buffer layer 537b as compared with the first foreign matter compensation layer 137 of the flexible organic light emitting display device 100 illustrated in FIGS. 1A to 1C. Hereinafter, for convenience of description, any duplicated description will be omitted merely for avoiding redundancy.

The first buffer layer 537a is on the first inorganic encapsulation layer 131 to cover the pixel area A/A and a portion of the bezel area B/A. The first buffer layer 537a may have substantially the same characteristic as the first foreign matter compensation layer 137 described in FIGS. 1A to 1C.

The second buffer layer 537b is on the first buffer layer 537a to cover the pixel area A/A and a portion of the bezel area B/A. An end of the second buffer layer 537b is positioned more inside than the end of the first inorganic encapsulation layer 131.

The second buffer layer 537b can be made of flowable silicon oxycarbon (SiOC). For example, the carbon content (%) of the second buffer layer 537b may be configured in a range of 30% to 50%. According to the configuration, the second buffer layer 537b may compensate the foreign matter generated in the first inorganic encapsulation layer 131 and may be easily bent or flexed. That is, the second buffer layer 537b may effectively compensate for cracks and seams generated by the foreign matter, yet allow for the desired flexibility. The thickness of the second buffer layer 537b may be configured to 1 μm to 2 μm.

If the aforementioned first buffer layer 537a and second buffer layer 537b minimize the possibility of a deformation failure while efficiently compensating the foreign matter generated on the cathode 143, it is contemplated that the thickness of the first buffer layer 537a and the second buffer layer 537b made of flowable silicon oxycarbon and the thickness of the second foreign matter compensation layer 133 made of dense silicon oxycarbon are maintained at a specific (predetermined) ratio.

In detail, the thickness of the first buffer layer 537a and the second buffer layer 537b is configured to be 20% to 66% of the entire thickness of all the foreign matter compensation layers (for example, the thickness of the first buffer layer 537a, the second buffer layer 537b, and the second foreign matter compensation layer 133). The thickness of the second foreign matter compensation layer 133 is configured to be 34% to 80% of the entire thickness of all the foreign matter compensation layers (for example, the entire thickness of the first buffer layer 537a, the second buffer layer 537b, and the protective layer 137). However, the thickness ratio is not limited thereto. According to the aforementioned thickness ratio, the first buffer layer 537a and the second buffer layer 537b may efficiently compensate the foreign matter generated on the cathode 143. In addition, the second foreign matter compensation layer 133 may efficiently protect the first buffer layer 537a and the second buffer layer 537b from plasma damage generated when depositing the second inorganic encapsulation layer 132. In this case, the entire thickness of the first buffer layer 537a, the second buffer layer 537b, and the second foreign matter compensation layer 133 may be configured in a range of 3 μm to 10 μm by considering flexibility of the flexible organic light emitting display device 500.

The surfaces of the first buffer layer 537a and the second buffer layer 537b made of flowable silicon oxycarbon may be selectively surface-curing treated.

In some exemplary embodiments, at least three foreign matter compensation layers configured by the silicon oxycarbon layer are disposed between the first inorganic encapsulation layer 131 and the second inorganic encapsulation layer 132. In this case, the carbon contents of respective layers are gradationally increased in an upward direction from the first buffer layer 537a disposed at the bottom layer to the second foreign matter compensation layer 133 disposed at the top layer. According to such a configuration, since the flowability of the silicon oxycarbon layers is increased in a downward direction, a function of directly compensating the foreign matter may be maximized on the bottom layer. Further, since the protection performance is increased in an upward direction, a function of protecting the silicon oxycarbon layers disposed at the lower side may be maximized.

Figure 6:
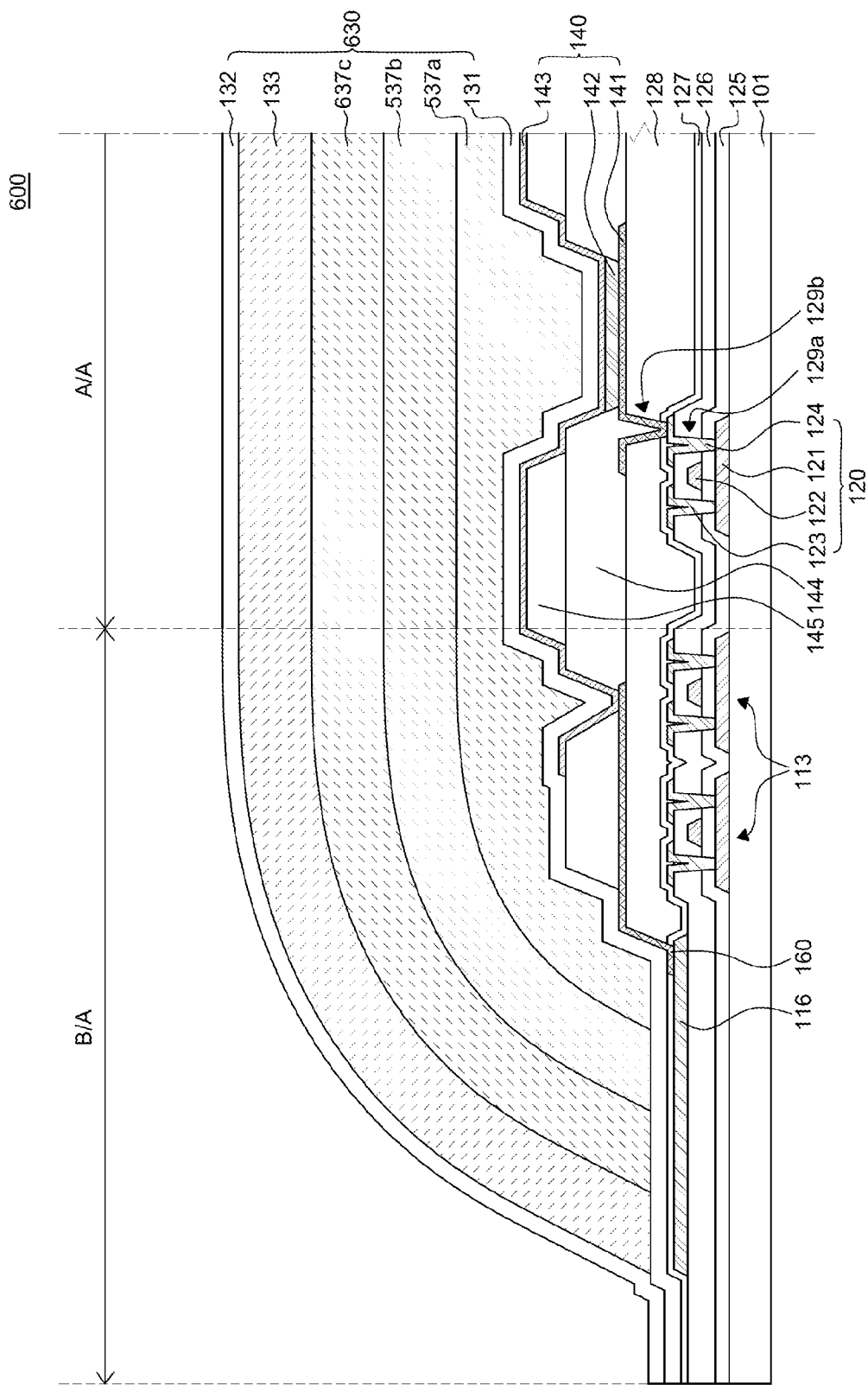

FIG. 6 is a schematic cross-sectional view for describing a flexible organic light emitting display device according to still another exemplary embodiment of the present disclosure. A flexible organic light emitting display device 600 illustrated in FIG. 6 further includes a third buffer layer 637c as compared with the flexible organic light emitting display device 500 illustrated in FIG. 5. Hereinafter, for convenience of description, any duplicated description will be omitted merely for avoiding redundancy.

The third buffer layer 637c is disposed between the second buffer layer 537b and the second foreign matter compensation layer 133. The third buffer layer 637c is disposed to cover the pixel area A/A and at least a portion of the bezel area B/A. In this case, an end of the third buffer layer 637c is configured to be positioned more inside than the end of the first inorganic encapsulation layer 131.

The carbon content of the third buffer layer 637c is configured in a range of 30% to 50%. Accordingly, three flowable silicon oxycarbon layers are sequentially on the first inorganic encapsulation layer 131.

In this case, the entire thickness of the first buffer layer 537a, the second buffer layer 537b, the third buffer layer 637c, and the second foreign matter compensation layer 133 may be configured in a range of 3 μm to 10 μm by considering flexibility of the flexible organic light emitting display device 600. In addition, the thickness of the first buffer layer 537a, the second buffer layer 537b, and the third buffer layer 637c is configured to be 20% to 66% of the entire thickness of the first buffer layer 537a, the second buffer layer 537b, the third buffer layer 637c, and the second foreign matter compensation layer 133. The thickness of the second foreign matter compensation layer 133 may be 34% to 80% of the entire thickness of the first buffer layer 537a, the second buffer layer 537b, the third buffer layer 637c, and the second foreign matter compensation layer 133. That is, flowable silicon oxycarbon layers and dense silicon oxycarbon layers are configured to have a predetermined thickness ratio. However, the thickness ratio is not limited thereto.

When the flexible organic light emitting display device 600 according to still another exemplary embodiment of the present disclosure is compared with the flexible organic light emitting display device 100, in the case where the thicknesses of the entire silicon oxycarbon layers are the same as each other since the number of interfaces of the silicon oxycarbon layers is relatively large, the moisture permeation path may be lengthened. Further, since the number of interfaces which may be surface-curing treated is large, the deformation due to plasma damage may be decreased and the performance for delaying moisture permeation may be further improved.

In some exemplary embodiments, at least two foreign matter compensation layers made of flowable silicon oxycarbon may be disposed between the first inorganic encapsulation layer 131 and the second inorganic encapsulation layer 132. That is, as illustrated in FIG. 5, two foreign matter compensation layers may be disposed between the first inorganic encapsulation layer 131 and the second inorganic encapsulation layer 132. As illustrated in FIG. 6, three foreign matter compensation layers may be disposed between the first inorganic encapsulation layer 131 and the second inorganic encapsulation layer 132, and four or more foreign matter compensation layers may be disposed between the first inorganic encapsulation layer 131 and the second inorganic encapsulation layer 132. According to such a configuration, since the number of interfaces of the foreign matter compensation layers is increased, the moisture permeation path may be lengthened, and the foreign matter compensation degree and the flatness degree may be further improved.

Figure 7:
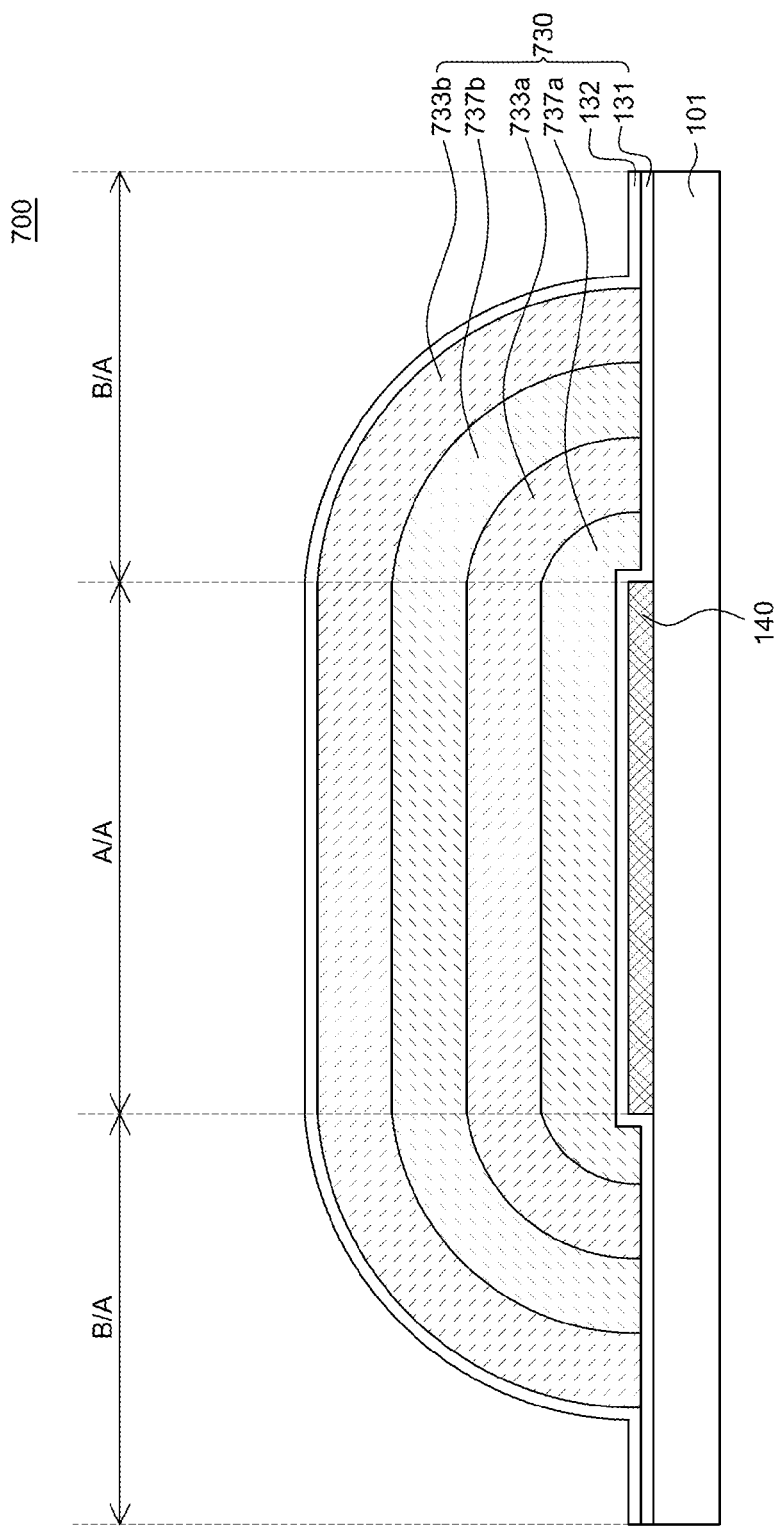

FIG. 7 is a schematic cross-sectional view for describing a flexible organic light emitting display device according to still another exemplary embodiment of the present disclosure. In a flexible organic light emitting display device 700 illustrated in FIG. 7, flowable foreign matter compensation layers and dense foreign matter compensation layers are alternately stacked, as compared with the flexible organic light emitting display device 100 illustrated in FIGS. 1A to 1C. Hereinafter, for convenience of description, any duplicated description will be omitted merely for avoiding redundancy. In FIG. 7, for convenience of description, the organic light emitting element 140 is briefly illustrated, and constituent elements such as the thin film transistor 120 are omitted merely for avoiding redundancy.

Referring to FIG. 7, a transparent flexible encapsulation unit 730 of the flexible organic light emitting display device 700 according to still another exemplary embodiment of the present disclosure is configured to cover the organic light emitting element 140. A flowable first foreign matter compensation layer 737a is on the first inorganic encapsulation layer 131, and a dense second foreign matter compensation layer 733a is on the first foreign matter compensation layer 737a. The first foreign matter compensation layer 737a is substantially the same as the first foreign matter compensation layer 137 illustrated in FIG. 1B. Also, the second foreign matter compensation layer 733a is substantially the same as the second foreign matter compensation layer 133 illustrated in FIG. 1B.

A third foreign matter compensation layer 737b is on the second foreign matter compensation layer 733a to cover the pixel area A/A and a portion of the bezel area B/A. An end of the third foreign matter compensation layer 737b is positioned more inside than the end of the first inorganic encapsulation layer 131. The third foreign matter compensation layer 737b may be made of flowable silicon oxycarbon (SiOC). The carbon contents of the first foreign matter compensation layer 737a and the third foreign matter compensation layer 737b may be different from each other in a range with flowability. For example, since the first foreign matter compensation layer 737a is disposed at the bottom, the carbon content of the first foreign matter compensation layer 737a is configured to be higher than the carbon content of the third foreign matter compensation layer 737b.

A fourth foreign matter compensation layer 733b is on the third foreign matter compensation layer 737b to cover the pixel area A/A and a portion of the bezel area B/A. An end of the fourth foreign matter compensation layer 733b is positioned more inside than the end of the first inorganic encapsulation layer 131. The fourth foreign matter compensation layer 733b may be made of dense silicon oxycarbon (SiOC). The carbon contents of the second foreign matter compensation layer 733a and the fourth foreign matter compensation layer 733b may be different from each other in a range substantially without having flowability. Since the fourth foreign matter compensation layer 733b is disposed at the top, the carbon content of the fourth foreign matter compensation layer 733b is configured to be lower than the carbon content of the second foreign matter compensation layer 733a.

According to such a configuration, one silicon oxycarbon layer compensates for the foreign matter, and a structure in which the silicon oxycarbon layer disposed thereon protects the silicon oxycarbon layer disposed therebelow is repeated. Particularly, according to such a configuration, the thickness of the second foreign matter compensation layer 733a and the fourth foreign matter compensation layer 733b as the dense silicon oxycarbon layers may be configured to be smaller than the thickness of the first foreign matter compensation layer 737a and the third foreign matter compensation layer 737b as the flowable silicon oxycarbon layers.

In FIG. 7, the structure of the silicon oxycarbon layers which are alternately repeated two times with a total of four layers is illustrated. However, an embodiment of the present disclosure may be modified and implemented to a structure of the silicon oxycarbon layers which are alternately repeated three times with six layers, four times with eight layers, or five times with ten layers, and the like. However, when the entire stacked thickness is increased, the flexibility of the flexible organic light emitting display device 700 deteriorates. As such, the entire thickness of the silicon oxycarbon layers should be 10 μm or less.

Figure 8:
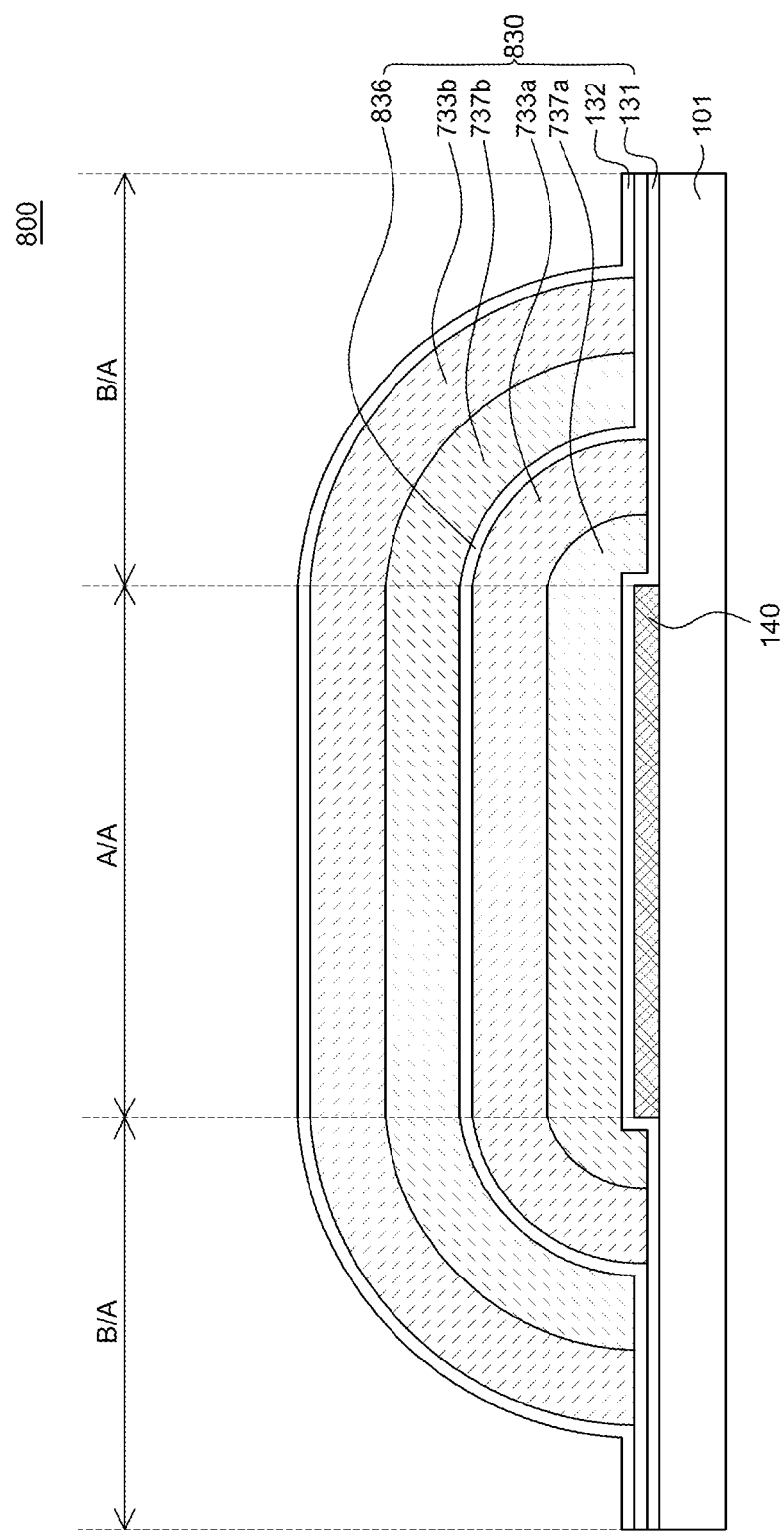

FIG. 8 is a schematic cross-sectional view for describing a flexible organic light emitting display device according to still another exemplary embodiment of the present disclosure. A flexible organic light emitting display device 800 illustrated in FIG. 8 further includes a third inorganic encapsulation layer 836 as compared with the flexible organic light emitting display device 700 illustrated in FIG. 7. Hereinafter, for convenience of description, any duplicated description will be omitted merely for avoiding redundancy.

In a flexible encapsulation unit 830, the third inorganic encapsulation layer 836 is added between the second foreign matter compensation layer 733a and the third foreign matter compensation layer 737b. In this case, the third inorganic encapsulation layer 836 may be formed by using the process and the material which may be used for the first inorganic encapsulation layer 131 or the second inorganic encapsulation layer 132. According to such a configuration, additional performance for delaying moisture permeation may be acquired. In particular, the third inorganic encapsulation layer 836 separates silicon oxycarbon layers having different flowability, which are alternately disposed in the middle. As a result, even though a crack occurs in the second inorganic encapsulation layer 132, the third inorganic encapsulation layer 836 may interrupt a direct moisture permeation path.

Figure 9:
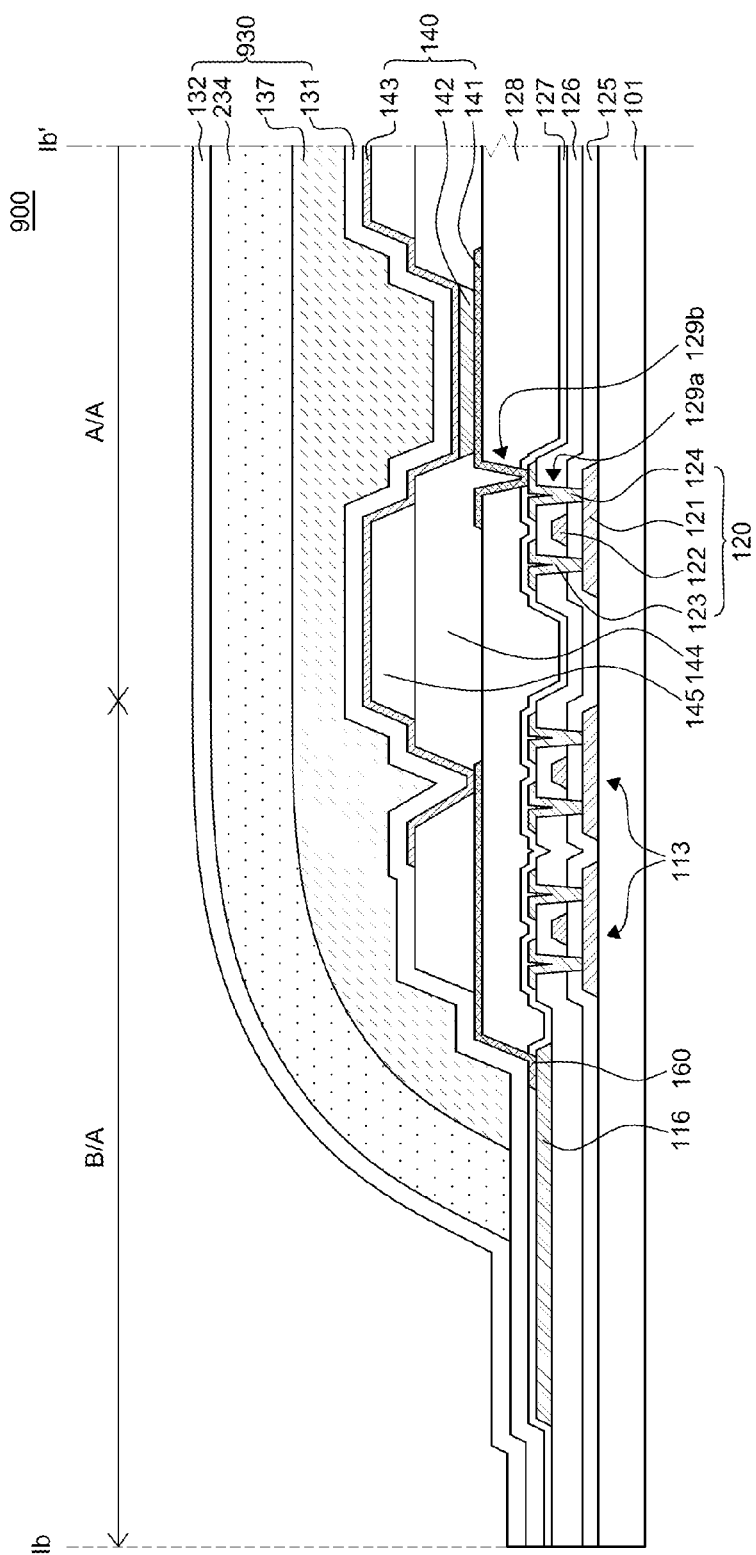

FIG. 9 is a schematic cross-sectional view of a flexible organic light emitting display device according to still another exemplary embodiment of the present disclosure. A flexible organic light emitting display device 900 illustrated in FIG. 9 does not include the second foreign matter compensation layer 133 as compared with the flexible organic light emitting display device 100 illustrated in FIG. 2. Hereinafter, for convenience of description, any duplicated description will be omitted merely for avoiding redundancy.

The planarization foreign matter compensation layer 234 is disposed in a portion of the bezel area B/A and the pixel area A/A between the first foreign matter compensation layer 137 and the second inorganic encapsulation layer 132 and is made of the organic material. The planarization foreign matter compensation layer 234 is made of the acrylic or epoxy based resin. The planarization foreign matter compensation layer 234 is formed through, for example, the screen printing process or the inkjet process.

The first foreign matter compensation layer 137 may protect the cathode 143 and the bank 144 from being damaged when the planarization foreign matter compensation layer 234 is formed by the screen printing process.

It is possible that the flexible organic light emitting display device 900 has a small thickness so as to have a lower critical radius of curvature. In particular, the thickness of the planarization foreign matter compensation layer 234 is relatively larger than that of the first foreign matter compensation layer 137. The flexible organic light emitting display device 900 having the lower critical radius of curvature is implemented by decreasing the thickness of the planarization foreign matter compensation layer 234. For example, if the planarization foreign matter compensation layer 234 has a thickness of 10 µm or less when being formed by using the screen printing process, a problem in that the organic light emitting element 140 is damaged by a screen printing mask having a mesh pattern during a squeegee process may occur.

As a result, in the flexible organic light emitting display device 900 according to another exemplary embodiment of the present disclosure, the first foreign matter compensation layer 137 is disposed below the planarization foreign matter compensation layer 234. The goal is to implement the planarization foreign matter compensation layer 234 with the small thickness substantially without damage of the organic light emitting element 140. Further, when the first foreign matter compensation layer 137 is disposed below the planarization foreign matter compensation layer 234, the planarization foreign matter compensation layer 234 may be formed with the thickness of 10 µm or less. Furthermore, the thicknesses of the first foreign matter compensation layer 137 is 2 µm or less even though both the first foreign matter compensation layer 137 and the planarization foreign matter compensation layer 234 are formed. Thus, the first foreign matter compensation layer 137 and the planarization foreign matter compensation layer 234 may be formed with a thickness which is smaller than 20 µm. Accordingly, since the thinner flexible organic light emitting display device 900 may be implemented, the critical radius of curvature of the flexible organic light emitting display device 200 may be reduced. That is, a decrease range of the thickness of the planarization foreign matter compensation layer 234 may be larger than an increase range of the thickness by the first foreign matter compensation layer 137.

In particular, as described with reference to FIGS. 1A to 1C, when the first foreign matter compensation layer 137 is made of silicon oxycarbon having low hardness and flowability, a foreign matter compensation layer serving as a protective layer is on the first foreign matter compensation layer 137. The goal is to protect plasma damage of the first foreign matter compensation layer 137, which may occur when the second inorganic encapsulation layer 132 is formed. However, the planarization foreign matter compensation layer 234 formed by the screen printing or inkjet printing method may not damage the first foreign matter compensation layer 137. Instead, the first foreign matter compensation layer 137 may suppress the damage caused due to the screen printing mask having the mesh pattern of the screen printing, which may occur when the planarization foreign matter compensation layer 234 is formed and further reduce the thickness.

A transparent flexible encapsulation unit 930 according to another exemplary embodiment of the present disclosure does not include the second foreign matter compensation layer 133 described in FIGS. 1B and 1C, in spite of using the screen printing by the aforementioned first foreign matter compensation layer 137 and planarization foreign matter compensation layer 234. Thus, a transparent flexible encapsulation unit 930 which is relatively thin may be implemented substantially without damage to the organic light emitting element 140. Accordingly, excellent performance for delaying moisture permeation and excellent flexibility may be achieved.

Figure 10A:
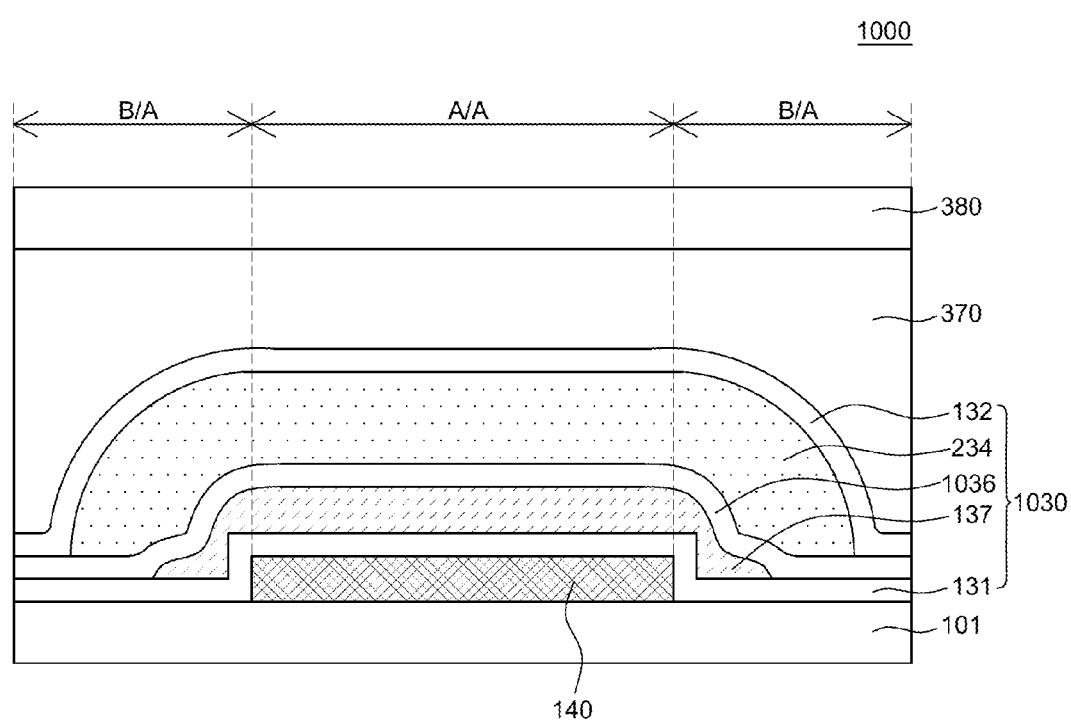
FIG. 10A is a schematic cross-sectional view of a flexible organic light emitting display device according to still another exemplary embodiment of the present disclosure.

FIG. 10A is a schematic cross-sectional view of a flexible organic light emitting display device according to still another exemplary embodiment of the present disclosure. A flexible organic light emitting display device 1000 illustrated in FIG. 10A further includes a third inorganic encapsulation layer 1036 as compared with the flexible organic light emitting display device 900 illustrated in FIG. 9. Hereinafter, for convenience of description, any duplicated description will be omitted merely for avoiding redundancy. In FIG. 10A, for convenience of description, the organic light emitting element 140 is briefly illustrated, and constituent elements such as the thin film transistor 120 are omitted merely for avoiding redundancy.

The third inorganic encapsulation layer 1036 is disposed between the first foreign matter compensation layer 137 and the planarization foreign matter compensation layer 234. The third inorganic encapsulation layer 1036 is disposed between the pixel area A/A and the bezel area B/A. As a result, the end of the third inorganic encapsulation layer 1036 is configured to be positioned more outside than the end of the first foreign matter compensation layer 137. Thus, the third inorganic encapsulation layer 1036 and the first inorganic encapsulation layer 131 directly contact each other outside the first foreign matter compensation layer 137. That is, the third inorganic encapsulation layer 1036 and the first inorganic encapsulation layer 131 which are adjacent to each other are configured to encapsulate the first foreign matter compensation layer 137 between the third inorganic encapsulation layer 1036 and the first inorganic encapsulation layer 131.

The third inorganic encapsulation layer 1036 is made of an aluminum based material. For example, the third inorganic encapsulation layer 1036 may be made of aluminum oxide. The third inorganic encapsulation layer 1036 may be deposited by using the atomic layer deposition method. Since the third inorganic encapsulation layer 1036 formed by the ALD method may compensate and cover the foreign matter below the third inorganic encapsulation layer 1036, the ALD method has an advantage of relatively significantly reducing generation of cracks and seams than the chemical vapor deposition method. Further, as described above, the first foreign matter compensation layer 137 formed below the third inorganic encapsulation layer 1036 is the silicon oxycarbon layer having flowability and the foreign matters are disposed below the first foreign matter compensation layer 137. Even when the first foreign matter compensation layer 137 conformally compensates the foreign matters and the step is thus generated, the third inorganic encapsulation layer 1036 is formed by aluminum oxide. Thus, the third inorganic encapsulation layer 1036 is achieved by using the atomic layer deposition method to compensate the steps (or irregularities) generated below the third inorganic encapsulation layer 1036. Further, the first foreign matter compensation layer 137 of the flexible organic light emitting display device 1000 according to another exemplary embodiment of the present disclosure is exposed to plasma when the third inorganic encapsulation layer 1036 is formed, the first foreign matter compensation layer 137 is surface-hardened. The step coverage (or ability to smooth out unevenness) by the third inorganic encapsulation layer 1036 is described in detail with reference to FIG. 10B.

Referring to FIG. 10A, the second inorganic encapsulation layer 132 is on the planarization foreign matter compensation layer 234. The second inorganic encapsulation layer 132 is disposed in the pixel area A/A and the bezel area B/A. As a result, the end of the second inorganic encapsulation layer 132 is configured to be positioned more outside than the end of the planarization foreign matter compensation layer 234. As a result, the second inorganic encapsulation layer 132 and the third inorganic encapsulation layer 1036 directly contact each other outside the planarization foreign matter compensation layer. That is, the second inorganic encapsulation layer 132 and the third inorganic encapsulation layer 1036 which are adjacent to each other are configured to encapsulate the planarization foreign matter compensation layer 234 between the second inorganic encapsulation layer 132 and the third inorganic encapsulation layer 1036.

The second inorganic encapsulation layer 132 is made of a silicon based material. For example, the second inorganic encapsulation layer 132 may be made of silicon nitride, silicon oxide, or silicon oxynitride. The second inorganic encapsulation layer 132 may be deposited by using the chemical vapor deposition method. The second inorganic encapsulation layer 132 is formed with a thickness in the range of 0.5 to 1.5 µm. As a result, a thickness of the second inorganic encapsulation layer 132 is larger than that of the third inorganic encapsulation layer 1036 deposited by using the atomic layer deposition method.

In the flexible organic light emitting display device 1000 according to yet another exemplary embodiment of the present disclosure, the second inorganic encapsulation layer 132 is on the top of the encapsulation unit. That is, as the second inorganic encapsulation layer 132 made of an inorganic material which has more excellent in moisture permeation suppression effect than the organic material is on the top of the encapsulation unit. The moisture and the oxygen that permeate the organic light emitting element 140 may be effectively interrupted.

Further, in the flexible organic light emitting display device 1000 according to another exemplary embodiment of the present disclosure, the third inorganic encapsulation layer 1036 made of the aluminum based material is on the first foreign matter compensation layer 137 having flowability and the second inorganic encapsulation layer 132 made of the silicon based material is on the planarization foreign matter compensation layer 234. This layer has excellent planarization characteristic. As a result, a moisture and oxygen interruption capability may be enhanced as compared with the encapsulation structure in the related art and the thickness of the flexible encapsulation unit 1030 may be reduced to the desired level.

Hereinafter, other effects of the flexible organic light emitting display device 1000 according to another exemplary embodiment of the present disclosure will be described in more detail with reference to FIG. 10B.

Figure 10B:
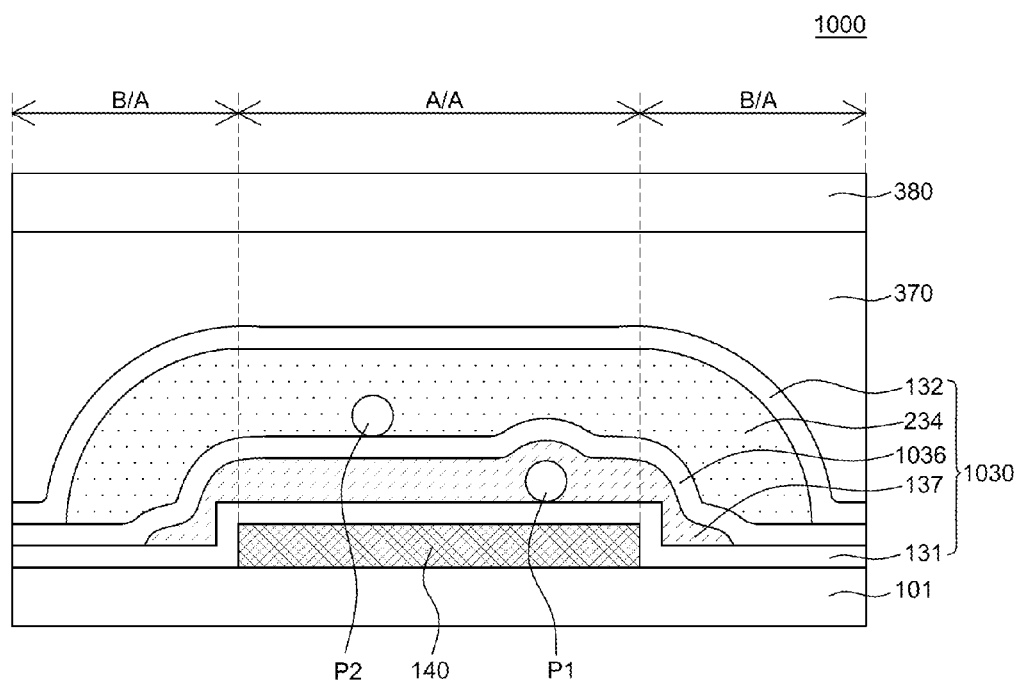
FIG. 10B is a schematic cross-sectional view for describing that foreign matters are disposed at an inside of a flexible organic light emitting display device according to still another exemplary embodiment of the present disclosure.

FIG. 10B is a schematic cross-sectional view for describing that foreign matters are disposed at an inside of the flexible organic light emitting display device according to still another exemplary embodiment of the present disclosure. In FIG. 10B, a case where foreign matters P1 and P2 are disposed between the first inorganic encapsulation layer 131 and the first foreign matter compensation layer 137 of the flexible organic light emitting display device 1000 and between the third inorganic encapsulation layer 1036 and the planarization foreign matter compensation layer 234 illustrated in FIG. 10A is illustrated.

As illustrated in FIG. 10B, while the foreign matter P1 is on the first inorganic encapsulation layer 131, the first foreign matter compensation layer 137 is formed. The first foreign matter compensation layer 137 is a conformal foreign matter compensation layer having flowability, which is disposed along the shape of the top of the first inorganic encapsulation layer 131. Thus, the first foreign matter compensation layer 137 may have a predetermined step (or irregularity) while compensating the foreign matters above the first inorganic encapsulation layer 131. As illustrated in FIG. 10B, the first inorganic encapsulation layer 131 is formed along the shape of the foreign matter P1 on the foreign matter P1. As a result, the step by the foreign matter P1 occurs in the first foreign matter compensation layer 137. Further, since the third inorganic encapsulation layer 1036 formed on the first foreign matter compensation layer 137 is made of aluminum oxide deposited by the atomic layer deposition method, the third inorganic encapsulation layer 1036 covers the entirety of the top of the first foreign matter compensation layer 137 to have a portion which protrudes at an area corresponding to the foreign matter P1. As a result, in the flexible organic light emitting display device 1000 according to an embodiment of the present disclosure, the step (or irregularity) of the protruded portion of the third inorganic encapsulation layer 1036 may be planarized by using the planarization foreign matter compensation layer 234 which is the planarization foreign matter compensation layer on the third inorganic encapsulation layer 1036.

Further, as illustrated in FIG. 10B, even when the foreign matter P2 is on the third inorganic encapsulation layer 1036, the planarization foreign matter compensation layer 234 of the third inorganic encapsulation layer 1036 planarizes the top of the third inorganic encapsulation layer 1036 to planarize the step by the foreign matter P2.

As described above, the second inorganic encapsulation layer 132 on the planarization foreign matter compensation layer 234 may be made of the silicon based material. For example, the second inorganic encapsulation layer 132 may be made of silicon nitride, silicon oxide, or silicon oxynitride deposited by using the chemical vapor deposition method. As described above, the planarization foreign matter compensation layer 234 may planarize the steps (or irregularities) which may occur by the foreign matters P1 and P2, even though the second inorganic encapsulation layer 132 is made of silicon nitride, silicon oxide, or silicon oxynitride by using the chemical vapor deposition method. Thus, a probability that the second inorganic encapsulation layer 132 will be cracked by the foreign matters P1 and P2 or the chance that seams will occur in the second inorganic encapsulation layer 132 may be remarkably reduced. Further, a time required to form the second inorganic encapsulation layer 132 may be reduced as compared with the case of forming the second inorganic encapsulation layer 132 by using the atomic layer deposition method.

In some exemplary embodiments, one or more additional encapsulation units in which the foreign matter compensation layer and the inorganic encapsulation layer are stacked may be on the second inorganic encapsulation layer 132. In this case, when the foreign matter compensation layer is the conformal foreign matter compensation layer, the inorganic encapsulation layer on the foreign matter compensation layer may be made of the aluminum based material and when the foreign matter compensation layer is the foreign matter compensation layer which is excellent in planarization characteristic, the inorganic encapsulation layer on the foreign matter compensation layer may be made of the silicon based material.

Figure 11:
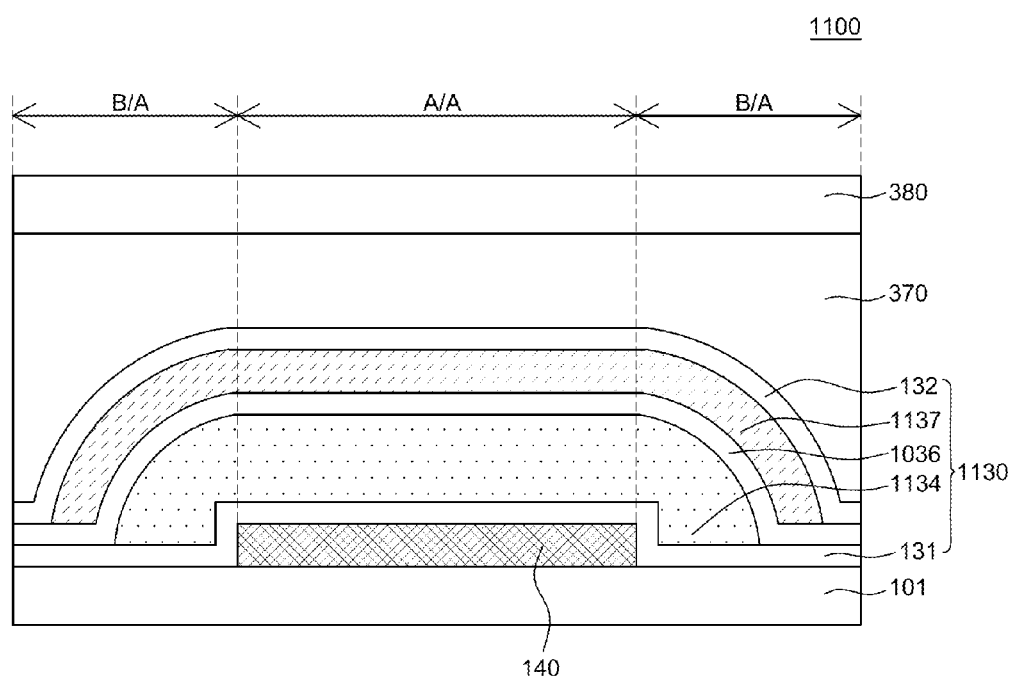
FIG. 11 is a schematic cross-sectional view for describing a flexible organic light emitting display device according to still another exemplary embodiment of the present disclosure.

FIG. 11 is a schematic cross-sectional view for describing a flexible organic light emitting display device according to still another exemplary embodiment of the present disclosure. Since a flexible organic light emitting display device 1100 illustrated in FIG. 11 is different from only in that layout positions of a first foreign matter compensation layer 1137 and a planarization foreign matter compensation layer 1134 are changed. As a result, the materials of the third inorganic encapsulation layer 1036 and the second inorganic encapsulation layer 132 are changed and substantially the same as the flexible organic light emitting display device 1000 illustrated in FIG. 10A, any duplicated description will be omitted merely for avoiding redundancy. In FIG. 11, for convenience of description, the organic light emitting element 140 is briefly illustrated, and constituent elements such as the thin film transistor 120 are omitted merely for avoiding redundancy.

Referring to FIG. 11, the planarization foreign matter compensation layer 1134 is configured to planarize the top of the first inorganic encapsulation layer 131. The planarization foreign matter compensation layer 1134 is formed to have a thickness of 10 μm or less.

The third inorganic encapsulation layer 1036 is on the planarization foreign matter compensation layer 1134. The third inorganic encapsulation layer 1036 is made of the silicon based material. For example, the third inorganic encapsulation layer 1036 may be made of silicon nitride, silicon oxide, or silicon oxynitride. The third inorganic encapsulation layer 1036 may be deposited by using the chemical vapor deposition method. The third inorganic encapsulation layer 1036 is formed with a thickness in the range of 0.5 to 1.5 μm.

In the flexible organic light emitting display device 1100 according to yet another exemplary embodiment of the present disclosure, the third inorganic encapsulation layer 1036 formed on the planarization foreign matter compensation layer 1134 which is the planarization foreign matter compensation layer is made of the silicon based material deposited by the chemical vapor deposition method. The inorganic film formed by using the chemical vapor deposition method is lower in step coverage performance than the inorganic film formed by the atomic layer deposition method. However, the planarization foreign matter compensation layer 1134 is the planarization foreign matter compensation layer, even though the third inorganic encapsulation layer 1036 is made of the silicon based material deposited on the planarization foreign matter compensation layer 1134 by the chemical vapor deposition method. Thus, a probability that the third inorganic encapsulation layer 1036 will be cracked or the seam will occur in the third inorganic encapsulation layer 1036 may be remarkably reduced. Further, a time required to form the third inorganic encapsulation layer 1036 may also be reduced as compared with the case of forming the third inorganic encapsulation layer 1036 by using the atomic layer deposition method.

Referring to FIG. 11, the first foreign matter compensation layer 1137 is formed along the shape of the top of the third inorganic encapsulation layer 1036. That is, the first foreign matter compensation layer 1137 is the conformal foreign matter compensation layer capable of compensating the foreign matter. The first foreign matter compensation layer 1137 may be made of a silicon oxycarbon or polyurea resin having flowability. The first foreign matter compensation layer 1137 is formed with a thickness of 3 μm or less and for example, a thickness of 1 to 2 μm.

The second inorganic encapsulation layer 132 is on the first foreign matter compensation layer 1137. The second inorganic encapsulation layer 132 is made of the aluminum based material. For example, the second inorganic encapsulation layer 132 may be made of aluminum oxide. The second inorganic encapsulation layer 132 may be deposited by using the atomic layer deposition method. The second inorganic encapsulation layer 132 is formed with a thickness of 0.1 μm.

In the flexible organic light emitting display device 1100 according to yet another exemplary embodiment of the present disclosure, the second inorganic encapsulation layer 132 formed on the first foreign matter compensation layer 1137 which is the conformal foreign matter compensation layer is made of the aluminum based material deposited by the atomic layer deposition method. Since the inorganic film formed by using the atomic layer deposition method (ALD) is more excellent in step coverage performance than the inorganic film formed by the chemical vapor deposition method (CVD), the second inorganic encapsulation layer 132 is made of the aluminum based material deposited on the first foreign matter compensation layer 1137. It is made by the atomic layer deposition method to compensate the step of the second inorganic encapsulation layer 131 generated by the foreign matter.

Some of the exemplary embodiments of the present disclosure may be described as follows.

The flexible organic light emitting display device including a pixel area and a bezel area includes a first inorganic encapsulation layer on an organic light emitting element of the pixel area, a second inorganic encapsulation layer that is relatively flatter than the first inorganic encapsulation layer, and encapsulates a plurality of foreign matter compensation layers by contacting the first inorganic encapsulation layer in the bezel area, and a foreign matter compensation layer structure in which the plurality of foreign matter compensation layers are stacked between the first inorganic encapsulation layer and the second inorganic encapsulation layer.

The first and second inorganic encapsulation layers and the foreign matter compensation layer structure may protect the organic light emitting element from oxygen and/or moisture.

The plurality of foreign matter compensation layers may be stacked on a basis of flowability of materials configuring the plurality of foreign matter compensation layers, suppression capability of damage which may be generated during manufacturing, flexibility, and reduction in thickness.

The plurality of foreign matter compensation layers may include a first foreign matter compensation layer having at least first hardness and foreign matter compensation capability and a second foreign matter compensation layer having second hardness relatively higher than the first hardness and configured to protect the first foreign matter compensation layer from the damage.

The foreign matter compensation layers including at least the first foreign matter compensation layer and the second foreign matter compensation layer may be configured to have a structure in which at least two flowable silicon oxycarbon layers formed by a chemical vapor deposition method are stacked.

The foreign matter compensation layers including at least the first foreign matter compensation layer and the second foreign matter compensation layer may be configured so that the carbon contents are gradationally reduced in an upward direction from a layer on a bottom layer to a layer on a top layer.

The flexible organic light emitting display device may further include a protective layer disposed between the first foreign matter compensation layer and the second foreign matter compensation layer and having relatively higher hardness and relatively lower flowability than the first foreign matter compensation layer.

An end of the first foreign matter compensation layer and an end of the second foreign matter compensation layer may be positioned more inside than an end of the first inorganic encapsulation layer, an end of the second inorganic encapsulation layer may be positioned more outside than the end of the first foreign matter compensation layer and the end of the second foreign matter compensation layer, and the second inorganic encapsulation layer may be configured to encapsulate the first foreign matter compensation layer and the second foreign matter compensation layer by bonding the first inorganic encapsulation layer in the bezel area.

The flexible organic light emitting display device may further include a planarization foreign matter compensation layer disposed in a portion of the bezel area and the pixel area between the second foreign matter compensation layer and the second inorganic encapsulation layer and having a thickness of 10 μm or less.

The flexible organic light emitting display device may further include a planarization foreign matter compensation layer disposed in a portion of the bezel area and the pixel area on the second inorganic encapsulation layer and made of an acryl resin, a silicon resin, or an epoxy resin.

The flexible organic light emitting display device may further include a pressure sensitive adhesive layer adhering to the planarization foreign matter compensation layer; and a barrier film on the pressure sensitive adhesive layer.

The flexible organic light emitting display device may further include an anti-oxidation layer disposed below the first inorganic encapsulation layer, in which the first foreign matter compensation layer may include at least oxygen, and the first inorganic encapsulation layer may be made of aluminum oxide.

The flexible organic light emitting display device may further include a third inorganic encapsulation layer disposed between the second foreign matter compensation layer and the planarization foreign matter compensation layer.

The second inorganic encapsulation layer may be made of a silicon based material, the third inorganic encapsulation layer may be made of an aluminum based material, step coverage performance of the third inorganic encapsulation layer may be relatively more excellent than the step coverage performance of the second inorganic encapsulation layer, and a thickness of the second inorganic encapsulation layer may be larger than a thickness of the third inorganic encapsulation layer.

The third inorganic encapsulation layer may be made of a silicon based material, the second inorganic encapsulation layer may be made of an aluminum based material, step coverage performance of the second inorganic encapsulation layer may be relatively more excellent than the step coverage performance of the third inorganic encapsulation layer, and a thickness of the third inorganic encapsulation layer may be larger than a thickness of the second inorganic encapsulation layer.

The flexible organic light emitting display device may further include a third foreign matter compensation layer disposed in a portion of the bezel area and the pixel area on the second foreign matter compensation layer; and a fourth foreign matter compensation layer disposed in a portion of the bezel area and the pixel area on the third foreign matter compensation layer, in which the third foreign matter compensation layer and the fourth foreign matter compensation layer may be configured of silicon oxycarbon (SiOC) having different carbon contents, and the carbon content of the third foreign matter compensation layer may be larger than the carbon content of the fourth foreign matter compensation layer.

The second foreign matter compensation layer may be made of acryl, silicon, or epoxy and on the first foreign matter compensation layer, and the first foreign matter compensation layer may be configured to protect the second foreign matter compensation layer while compensating a foreign matter.

Some of the exemplary embodiments of the present disclosure may be described as follows.

A flexible organic light emitting display device including a pixel area and a bezel area includes: a first inorganic encapsulation layer disposed in the pixel area and the bezel area; a first foreign matter compensation layer disposed in a portion of the bezel area and the pixel area on the first inorganic encapsulation layer; a second foreign matter compensation layer disposed in a portion of the bezel area and the pixel area on the first foreign matter compensation layer and having higher hardness than the first foreign matter compensation layer; and a second inorganic encapsulation layer disposed in the pixel area and the bezel area on the second foreign matter compensation layer, in which the first inorganic encapsulation layer and the second inorganic encapsulation layer may be configured to encapsulate the first foreign matter compensation layer and the second foreign matter compensation layer in the bezel area.

The first foreign matter compensation layer has flowability, and flowability of the second foreign matter compensation layer may be relatively lower than the flowability of the first foreign matter compensation layer.

The first foreign matter compensation layer and the second foreign matter compensation layer may be configured of silicon oxycarbon (SiOC) having different carbon contents, and the carbon content of the first foreign matter compensation layer may be larger than the carbon content of the second foreign matter compensation layer.

An end of the first foreign matter compensation layer and an end of the second foreign matter compensation layer may be positioned more inside than an end of the first inorganic encapsulation layer, an end of the second inorganic encapsulation layer may be positioned more outside than the end of the first foreign matter compensation layer and the end of the second foreign matter compensation layer, and the second inorganic encapsulation layer may be configured to encapsulate the first foreign matter compensation layer and the second foreign matter compensation layer by bonding the first inorganic encapsulation layer in the bezel area.

The first inorganic encapsulation layer and the second inorganic encapsulation layer may be made of aluminum oxide.

The flexible organic light emitting display device may further include a planarization foreign matter compensation layer disposed in a portion of the bezel area and the pixel area between the second foreign matter compensation layer and the second inorganic encapsulation layer.

A thickness of the planarization foreign matter compensation layer may be 10 μm or less.

The flexible organic light emitting display device may further include a planarization foreign matter compensation layer disposed in a portion of the bezel area and the pixel area on the second inorganic encapsulation layer and made of an organic material.

The planarization foreign matter compensation layer may be made of an acryl resin, a silicon resin, or an epoxy resin.

The flexible organic light emitting display device may further include a pressure sensitive adhesive layer adhering to the planarization foreign matter compensation layer; and a barrier film on the pressure sensitive adhesive layer.

The flexible organic light emitting display device may further include an anti-oxidation layer disposed below the first inorganic encapsulation layer, in which the first foreign matter compensation layer may include at least oxygen, and the first inorganic encapsulation layer may be made of aluminum oxide.

The foreign matter compensation layers including at least the first foreign matter compensation layer and the second foreign matter compensation layer may be configured to have a structure in which at least two flowable silicon oxycarbon layers formed by a chemical vapor deposition method are stacked.

The foreign matter compensation layers including at least the first foreign matter compensation layer and the second foreign matter compensation layer may be configured so that the carbon contents are gradationally reduced in an upward direction from a layer on a bottom layer to a layer on a top layer.

The flexible organic light emitting display device may further include a third inorganic encapsulation layer disposed between the second foreign matter compensation layer and the planarization foreign matter compensation layer.

The flexible organic light emitting display device may further include a third foreign matter compensation layer disposed in a portion of the bezel area and the pixel area on the second foreign matter compensation layer; and a fourth foreign matter compensation layer disposed in a portion of the bezel area and the pixel area on the third foreign matter compensation layer, in which the third foreign matter compensation layer and the fourth foreign matter compensation layer may be configured of silicon oxycarbon (SiOC) having different carbon contents, and the carbon content of the third foreign matter compensation layer may be larger than the carbon content of the fourth foreign matter compensation layer.

Some of the exemplary embodiments of the present disclosure may be described as follows.

A flexible organic light emitting display device includes a first inorganic encapsulation layer conformally configured on an organic light emitting element so as to protect the organic light emitting element from oxygen and moisture, a plurality of foreign matter compensation layers on the first inorganic encapsulation layer and having interfaces configured to reduce a step of the first inorganic encapsulation layer, and a second inorganic encapsulation layer on a plurality of foreign matter compensation layers and configured to be relatively flatter than the first inorganic encapsulation layer, protect the organic light emitting element from oxygen and moisture, and encapsulate a plurality of foreign matter compensation layers by contacting the first inorganic encapsulation layer in the bezel area, in which the first foreign matter compensation layer may be disposed below among the plurality of foreign matter compensation layers and have flowability and the second foreign matter compensation layer may be disposed above among the plurality of foreign matter compensation layers to correspond to the first foreign matter compensation layer.

The second foreign matter compensation layer may be made of acryl, silicon, or epoxy and on the first foreign matter compensation layer, and the first foreign matter compensation layer may be configured to protect the second foreign matter compensation layer while compensating a foreign matter.

The flexible organic light emitting display device may further include a third inorganic encapsulation layer disposed between the first foreign matter compensation layer and the second foreign matter compensation layer and configured to contact the first inorganic encapsulation layer in the bezel area and contact the second inorganic encapsulation layer in the bezel area.

The second inorganic encapsulation layer may be made of a silicon based material, the third inorganic encapsulation layer may be made of an aluminum based material, step coverage performance of the third inorganic encapsulation layer may be relatively more excellent than the step coverage performance of the second inorganic encapsulation layer, and a thickness of the second inorganic encapsulation layer may be larger than a thickness of the third inorganic encapsulation layer.

The first foreign matter compensation layer may be made of acryl, silicon, or epoxy and on the second foreign matter compensation layer, and the second foreign matter compensation layer may be configured by flowable silicon oxycarbon or polyurea.

The flexible organic light emitting display device may further include a protective layer disposed between the first foreign matter compensation layer and the second foreign matter compensation layer and having relatively higher hardness and relatively lower flowability than the first foreign matter compensation layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. The protective scope of the present disclosure should be construed based on the following claims, and all the technical concepts in the equivalent scope thereof should be construed as falling within the scope of the present disclosure.

It will be apparent to those skilled in the art that various modifications and variation can be made in the present invention without departing from the concepts and scope of the invention. Thus, it is intended that the present invention cover the modifications and variations of this invention provided they come within the scope of the appended claims and their equivalents.

What is claimed is:

1. A self-emission type of display device comprising:
   a light emitting element including an anode and a cathode facing each other, and a light emission layer interposed between the anode and the cathode;
   a first inorganic layer on the light emitting element, configured to protect the light emitting element from at least one of oxygen and moisture;
   an organic structure on the first inorganic layer, included a first organic layer and a second organic layer on the first organic layer; and
   a second inorganic layer on the second organic layer, configured to encapsulate the organic structure by covering upper and side surface of the organic structure, wherein an end of the first inorganic layer and an end of the second inorganic layer is disposed more outside than an end of the first organic layer and an end of the second organic layer, wherein a carbon content of the first organic layer is larger than a carbon content of the second organic layer, and wherein the first organic layer has a first hardness and the second organic layer has a second hardness relatively higher than the first hardness.

2. The self-emission type of display device according to claim 1, wherein the second organic layer is configured to protect the first organic layer from plasma damage during a manufacturing process of the second inorganic layer.

3. The self-emission type of display device according to claim 1, wherein the carbon content of the first organic layer is within a range of 30% to 50% and the carbon content of the second organic layer is within a range of 5% to 30%.

4. The self-emission type of display device according to claim 1, wherein the first organic layer and the second organic layer are configured of a silicon oxycarbon (SiOC) having different carbon contents.

5. The self-emission type of display device according to claim 4, further comprising:

a planarization foreign matter compensation layer disposed on the second inorganic layer.

6. The self-emission type of display device according to claim 4, further comprising:

a planarization foreign matter compensation layer disposed between the second inorganic layer and the second organic layer.

7. A self-emission type of display device comprising:

a light emitting element including an anode and a cathode facing each other, and a light emission layer interposed between the anode and the cathode;

a first inorganic layer on the light emitting element, configured to protect the light emitting element from at least one of oxygen and moisture;

an organic structure on the first inorganic layer, included a first organic layer and a second organic layer on the first organic layer; and a second inorganic layer on the second organic layer, configured to encapsulate the organic structure by covering upper and side surface of the organic structure, wherein the first organic layer is configured of a silicon oxycarbon (SiOC) and the second organic layer is configured of an acryl resin, a silicon resin, or an epoxy resin, and a thickness of the second organic layer is relatively larger than a thickness of the first organic layer.

8. The self-emission type of display device according to claim 7, further comprising:

a planarization foreign matter compensation layer disposed on the second inorganic layer.

9. The self-emission type of display device according to claim 7, further comprising:

a planarization foreign matter compensation layer disposed between the second inorganic layer and the second organic layer.

10. A self-emission type of display device comprising:

a light emitting element including an anode and a cathode facing each other, and a light emission layer interposed between the anode and the cathode;

a first inorganic layer on the light emitting element, configured to protect the light emitting element from at least one of oxygen and moisture;

an organic structure on the first inorganic layer, included a first organic layer and a second organic layer on the first organic layer; and a second inorganic layer on the second organic layer, configured to encapsulate the organic structure by covering upper and side surface of the organic structure, wherein the first organic layer is configured of an acryl resin, a silicon resin, or an epoxy resin and the second organic layer is configured of a silicon oxycarbon (SiOC), and a thickness of the first organic layer is relatively larger than a thickness of the second organic layer.

11. The self-emission type of display device according to claim 10, further comprising:

a planarization foreign matter compensation layer disposed on the second inorganic layer.

12. The self-emission type of display device according to claim 10, further comprising:

a planarization foreign matter compensation layer disposed between the second inorganic layer and the second organic layer.

* * * * *